(12) United States Patent
Kawahito

(10) Patent No.: US 8,704,694 B2
(45) Date of Patent: Apr. 22, 2014

(54) A/D CONVERTER

(75) Inventor: Shoji Kawahito, Hamamatsu (JP)

(73) Assignee: National University Corporation Shizuoka University (JP)

( * ) Notice: Subject to any disclaimer, the term of this patent is extended or adjusted under 35 U.S.C. 154(b) by 0 days.

(21) Appl. No.: 13/697,162

(22) PCT Filed: May 13, 2011

(86) PCT No.: PCT/JP2011/061040
§ 371 (c)(1),
(2), (4) Date: Jan. 11, 2013

(87) PCT Pub. No.: WO2011/142452
PCT Pub. Date: Nov. 17, 2011

(65) Prior Publication Data
US 2013/0120180 A1    May 16, 2013

(30) Foreign Application Priority Data

May 14, 2010   (JP) ................. P2010-112440

(51) Int. Cl.
*H03M 1/38* (2006.01)
(52) U.S. Cl.
USPC ........... 341/161; 341/155; 341/160; 341/163; 341/165
(58) Field of Classification Search
USPC ................................. 341/150–165
See application file for complete search history.

(56) References Cited

U.S. PATENT DOCUMENTS

| | | | |
|---|---|---|---|
| 5,264,849 A * | 11/1993 | Kondoh et al. | 341/155 |
| 6,100,830 A * | 8/2000 | Dedic | 341/155 |
| 7,227,490 B2 * | 6/2007 | Kawahito | 341/155 |
| 7,345,615 B2 * | 3/2008 | Kawahito | 341/162 |
| 7,598,896 B2 * | 10/2009 | Kawahito | 341/162 |
| 7,889,111 B2 * | 2/2011 | Kawahito | 341/162 |
| 7,893,859 B2 * | 2/2011 | Kawahito | 341/161 |
| 8,149,150 B2 * | 4/2012 | Kawahito | 341/155 |

FOREIGN PATENT DOCUMENTS

| | | |
|---|---|---|
| JP | 64-67034 | 3/1989 |
| JP | 7-202700 | 8/1995 |
| JP | 2004-304413 | 10/2004 |

(Continued)

OTHER PUBLICATIONS

Krishnaswami, Nagaraj "Efficient Circuit Configurations for Algorithmic Analog to Digital Converters", IEEE Trans. Circuits and Systems II, vol. 40, No. 12, pp. 777-785 (1993).

(Continued)

*Primary Examiner* — Lam T Mai
(74) *Attorney, Agent, or Firm* — Ostrolenk Faber LLP

(57) ABSTRACT

An A/D converter 101 comprises a first cyclic A/D converter circuit 103 and an A/D converter circuit 105. The A/D converter 101 includes a record circuit 107 for storing conversion results from the A/D converter circuits 103, 105. The record circuit 107 includes an upper-bit record circuit 107a and a lower-bit circuit 107b. The cyclic A/D converter circuit 103 receives an analog value SA and generates a first digital value SD1 indicating the analog value SA and a residue value RD. The A/D converter circuit 105 receives the residue value RD and generates a second digital value SD2 having lower M bits indicating the residue value RD. The conversion accuracy in the A/D converter circuit 105 can be lowered to $1/2^L$ that in the A/D converter circuit 103.

8 Claims, 16 Drawing Sheets

(56) References Cited

FOREIGN PATENT DOCUMENTS

| | | |
|---|---|---|
| JP | 2005-109747 | 4/2005 |
| JP | 2005-136540 | 5/2005 |
| JP | 2008-28820 | 2/2008 |

OTHER PUBLICATIONS

S. Matsuo et al. "A Very Low column FPN and Row Temporal Noise 8.9 M-Pixel, 60 fps CMOS Image Sensor With 14bit Column Parallel SA-ADC", Dig. Tech. Papers, Symp. VLSI Circuits, pp. 138-139 (2008).

M.F. Snoeij et al. "A CMOS Image Sensor With a Column-Level Multiple-Ramp Single-Slope ADC" Dig. Tech. Papers, ISSCC, pp. 506-507 (2007).

International Search Report of PCT/JP2011/061040—date of International Search Report Jun. 7, 2011.

English Translation of the International Preliminary Report on Patentability dated Jan. 24, 2013 for counterpart PCT Application PCT/JP2011/061040.

* cited by examiner (a)

(b)

(a)

(b)

A/D CONVERTER

CROSS-REFERENCE TO RELATED APPLICATIONS

The present application is a 35 U.S.C. §§371 national phase conversion of PCT/JP2011/061040, filed May 13, 2011, which claims priority of Japanese Patent Application No. 2010-112440, filed May 14, 2010, the contents of which are incorporated herein by reference. The PCT International Application was published in the Japanese language.

TECHNICAL FIELD

The present invention relates to an A/D converter which converts a signal from an image sensor into a digital value of N+M bits (where N≥2, M≥2).

BACKGROUND ART

Patent Literature 1 describes a two-stage A/D converter for image sensors. Patent Literature 2 describes a one-stage cyclic A/D converter arranged in a column of an image sensor. Patent Literature 3 includes a later-stage parallel A/D converter which obtains a digital value of an upper bit by using a first-stage A/D converter and produces a digital value of a lower bit by D/A-converting the digital value. Patent Literature 4 discloses a parallel A/D converter, a 1-bit-cell-pipeline A/D converter for obtaining a lower bit by A/D-converting the result of subtracting the D/A-converted result of the parallel A/D conversion from an input signal and an adder for determining a digital code corresponding to an analog input signal from the output of the parallel A/D converter and the output of the 1-bit-cell-pipeline A/D converter.

Non Patent Literature 1 describes a cyclic A/D converter. Non Patent Literature 2 describes an SA (Successive Approximation)-A/D converter employed in a CMOS image sensor. Non Patent Literature 3 describes a single-slope A/D converter employed in a CMOS image sensor.

CITATION LIST

Patent Literature

Patent Literature 1: Japanese Patent Application Laid-Open No. 2004-304413 (Japanese Patent No. 4069203)
Patent Literature 2: Japanese Patent Application Laid-Open No. 2005-136540 (Japanese Patent No. 3962788)
Patent Literature 3: Japanese Patent Application Laid-Open No. 64-67034
Patent Literature 4: Japanese Patent Application Laid-Open No. 07-202700

Non Patent Literature

Non Patent Literature 1: K. Nagaraj, "Efficient circuit configuration for algorithmic analog to digital converters," IEEE Trans. Circuits and Systems II, vol. 40, No. 12, pp. 777-785, 1993
Non Patent Literature 2: S. Matsuo et al., "A very low column FPN and row temporal noise 8.9 M-Pixel, 60 fps CMOS image sensor with 14 bit column parallel SA-ADC," Dig. Tech. Papers, Symp. VLSI Circuits, pp. 138-139, 2008
Non Patent Literature 3: F. Snoeij, et al., "A CMOS image sensor with a column-parallel multiple-ramp single-slope ADC," Dig. Tech. Papers, ISSCC, pp. 506-506, 2007

SUMMARY OF INVENTION

Technical Problem

Patent Literature 1 provides an A/D conversion function, while reducing the noise of the image sensor by using an amplifier. For fully exhibiting these effects, this circuit is required to have a higher gain in the amplifier and attain a resolution of the A/D conversion corresponding to the gain (e.g., 4 bits at a gain of 16×). This complicates the circuit scale. Each of Patent Literatures 3 and 4 uses a serial-parallel AD converter at the first stage, which feeds the residue value to the A/D converter at the later stage. Non Patent Literatures 2 and 3 disclose no cyclic A/D converter circuit. A cyclic A/D converter circuit can provide low noise and wide dynamic range by a single converter circuit. According to the knowledge of the inventor, connecting the cyclic A/D converter circuit to another A/D converter circuit or a different cyclic A/D converter circuit can yield characteristic features of the single cyclic A/D converter circuit and further advantages.

Under such circumstances, it is an object of the present invention to provide an A/D converter which uses A/D converter circuits for upper and lower digits of an A/D conversion and can lower the A/D conversion accuracy in the A/D converter circuit for the lower digit by employing a cyclic A/D conversion scheme for the upper digit.

Solution to Problem

One aspect of the present invention is an A/D converter which converts a signal from an image sensor into a digital value of N+M bits (where N≥2, M≥2). This A/D converter is arranged in a column of the image sensor. The A/D converter comprises (a) a first cyclic A/D converter circuit for receiving an analog value and generating a first digital value having upper N bits indicating the analog value and a residue value and (b) an A/D converter circuit for receiving the residue value and generating a second digital value having lower M bits indicating the residue value. The first cyclic A/D converter circuit includes a sub A/D converter circuit, a logic circuit, a D/A converter circuit, and an arithmetic unit. The sub A/D converter circuit generates a part of the first digital value having an N-bit digital value as N1 bits (where N1<N) for each cycle. The logic circuit receives the digital value from the sub A/D converter circuit. The D/A converter circuit generates a D/A-converted value corresponding to the signal from the logic circuit. The arithmetic unit has an input, an output for providing the residue value, and a feedback path connecting the output and input to each other for a cyclic A/D conversion. The arithmetic unit amplifies the input value received at the input, generates a difference between the amplified input value and the D/A-converted value, and feeds the difference to the output.

This A/D converter generates upper N bits by L cycles (where L is 2 or greater) in the first cyclic converter circuit. The A/D converter circuit at the first stage can provide the $2^L$-times-amplified residue component by L cyclic actions in the cyclic A/D conversion. Thus amplified residue component is fed to the A/D converter circuit for the lower bit. This can lower the conversion accuracy in the A/D converter circuit at the second stage to $1/2^L$ that in the A/D converter circuit at the first stage. Therefore, an A/D converter circuit with an accuracy lower than that of the A/D converter circuit at the first stage can be employed as the A/D converter circuit at the second stage.

The A/D converter in accordance with one aspect of the present invention can perform any of cyclic, integrating, and successive approximation A/D conversions. Since the A/D converter circuit at the first stage performs the cyclic A/D conversion, the accuracy required for the A/D conversion at the second stage can be made lower than that at the first stage in this A/D converter.

Preferably, in the A/D converter in accordance with one aspect of the present invention, the A/D converter circuit includes an integrating A/D conversion such as a single-scope A/D converter circuit. This A/D converter can provide an A/D conversion having a favorable linearity when the A/D converter circuit at the second stage performs the single-scope A/D conversion. This circuit is advantageous in that its circuit structure is very simple, but necessitates a long conversion time for attaining a high resolution. Since the A/D converter circuit at the first stage performs the cyclic A/D conversion, the accuracy required for the A/D conversion at the second stage can be made lower than that at the first stage. This allows the A/D converter circuit at the second stage to act at high speed, whereby the advantage of the single-slope A/D conversion can be utilized.

Preferably, in the A/D converter in accordance with one aspect of the present invention, the A/D converter circuit includes a successive approximation A/D converter circuit. When the A/D converter circuit at the second stage performs the successive approximation A/D conversion in this A/D converter, the number of components (e.g., resistors and capacitors) increases exponentially in order for the successive approximation A/D converter circuit at the second stage to attain a high accuracy. When the A/D converter circuit at the second stage performs the successive approximation A/D conversion, however, the accuracy required for the successive approximation A/D converter circuit is not high. Therefore, the circuit scale of the A/D converter circuit at the second stage can be made smaller, whereby the advantage of the successive approximation can be utilized.

Preferably, in the A/D converter in accordance with one aspect of the present invention, the A/D converter circuit includes a cyclic A/D converter circuit. Since the A/D converter circuit at the first stage performs the cyclic A/D conversion, the cyclic A/D converter circuit at the second stage does not require high conversion accuracy in this A/D converter. Therefore, the cyclic A/D converter circuit at the second stage can be constructed by smaller capacitors and/or smaller-sized transistors as compared with those constituting the cyclic A/D converter circuit at the first stage, and the power consumption in the A/D converter circuit at the second stage can be cut down greatly.

In the A/D converter in accordance with one aspect of the present invention, the A/D converter circuit holds the residue value and performs an A/D conversion for generating the second digital value. The first cyclic A/D converter circuit feeds the residue value to the A/D converter circuit and then performs a cyclic A/D conversion of the next analog signal. Since the A/D converter circuit at the second stage holds the residue value in this A/D converter, the A/D converter circuit at the first stage can thereafter process the next signal from the image sensor, so as to provide pipeline processing. The integrating A/D converter circuit and successive approximation A/D converter circuit in the A/D converter circuit at the second stage may include a sample and hold circuit, for example.

In the A/D converter in accordance with one aspect of the present invention, the first cyclic A/D converter circuit may generate in each cycle a redundant code in which each of the N bits has a ternary digital value for the A/D conversion processing. In this A/D converter, the output value of the sub A/D converter circuit is not affected by the offset in the sub A/D converter circuit in the A/D converter circuit at the first stage.

Preferably, in the A/D converter in accordance with one aspect of the present invention, the first cyclic A/D converter circuit generates in each cycle a non-redundant code having a binary digital value for the A/D conversion processing, while the A/D converter circuit has an input range greater than a voltage range of an input range of the first cyclic A/D converter circuit. Since the A/D converter circuit at the second stage has an over-range characteristic, the offset in the sub A/D converter circuit in the first cyclic A/D converter circuit can be inhibited from affecting the A/D-converted value having N+M bits.

The A/D converter in accordance with one aspect of the present invention may further comprise a correlated double sampling circuit connected between the image sensor and the first cyclic A/D converter circuit. A pixel circuit of the image sensor generates a first signal level including a noise component and a second signal level including a signal component superposed on the noise component, while the correlated double sampling circuit receives the first and second signal levels and generates the analog signal, the analog signal indicating a difference between the first and second signal levels. The correlated double sampling circuit can receive a signal from a different pixel circuit of the image sensor after feeding the analog signal to the first cyclic A/D converter circuit.

The A/D converter can perform correlated double sampling for the analog signal before the A/D conversion. For the correlated double sampling, the correlated double sampling circuit receives a signal from a different pixel circuit of the image sensor after feeding the analog signal to the first cyclic A/D converter circuit. Therefore, pipeline processing can be employed for signals from the image sensor.

In the A/D converter in accordance with one aspect of the present invention, the A/D converter circuit may include a second cyclic A/D converter circuit. The first cyclic A/D converter circuit includes a first capacitor for sampling an input signal to the first cyclic A/D converter circuit, a second capacitor, and a first operational amplifier circuit, while a ratio between the capacitance of the first capacitor and the capacitance of the second capacitor determines an amplification factor in an amplification using the first operational amplifier circuit. The second cyclic A/D converter circuit includes a third capacitor for sampling an input signal to the second cyclic A/D converter circuit, a fourth capacitor, and a second operational amplifier circuit, while a ratio between the capacitance of the third capacitor and the capacitance of the fourth capacitor determines an amplification factor in an amplification using the second operational amplifier circuit. One of the following is satisfied: the third and fourth capacitors have sizes smaller than those of the first and second capacitors, respectively; and the first operational amplifier circuit has a size smaller than that of the second operational amplifier circuit. In this A/D converter, the conversion accuracy of the second cyclic A/D converter circuit may be lower than that of the first cyclic A/D converter circuit, whereby the circuit structure of the second cyclic A/D conversion circuit can be made simpler correspondingly.

Advantageous Effects of Invention

As explained in the foregoing, the above-mentioned aspect of the present invention provides an A/D converter which uses A/D converter circuits for upper and lower digits of an A/D conversion and can lower the A/D conversion accuracy in the A/D converter circuit for the lower digit by employing a cyclic A/D conversion scheme for the upper digit.

DESCRIPTION OF EMBODIMENTS

In the following, preferred embodiments of an A/D converter which converts a signal from an image sensor into a digital value of N+M bits (where N≥2, M≥2) will be explained with reference to the drawings. The same parts will be referred to with the same signs when possible.

Figure 1:
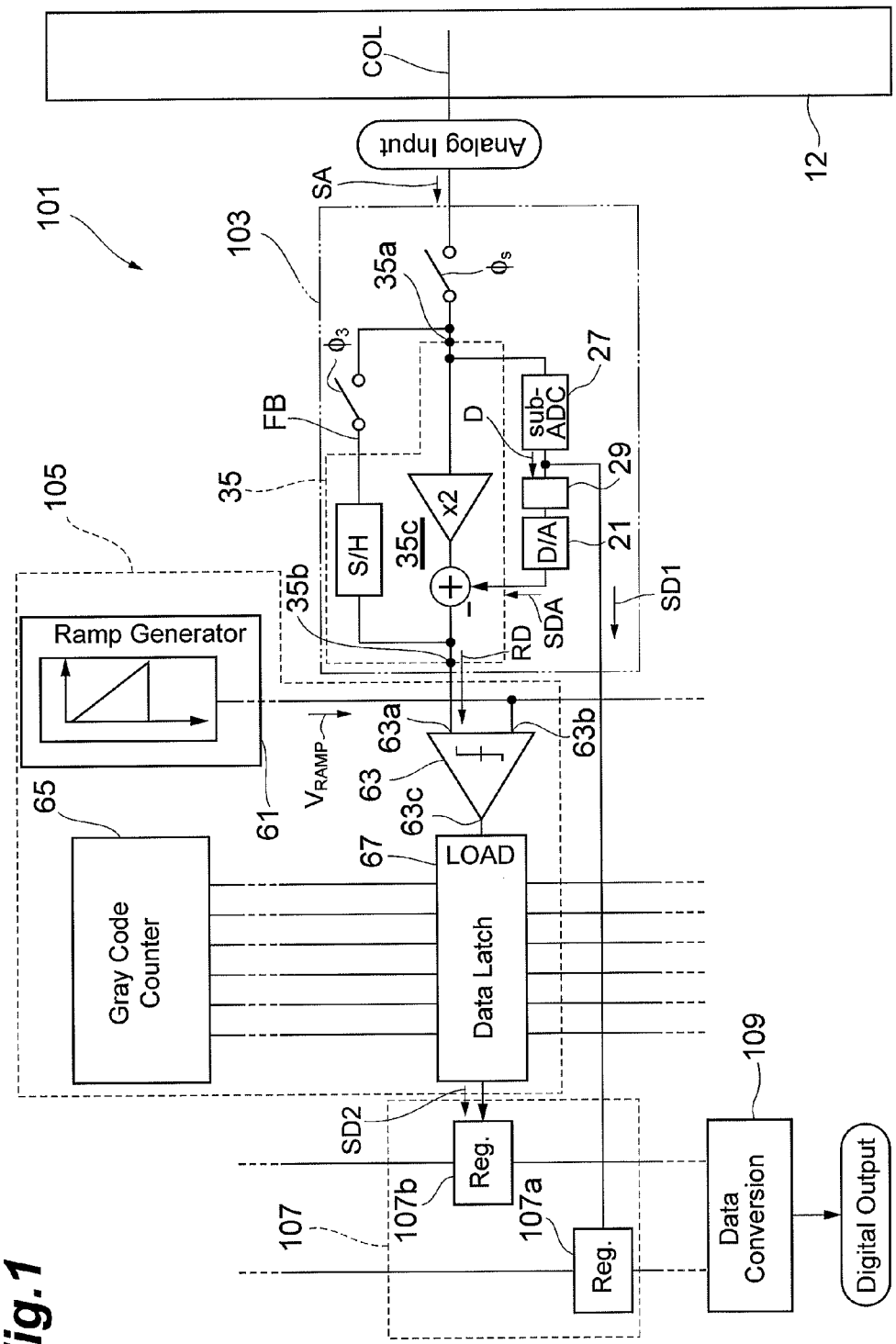
FIG. 1 is a diagram schematically illustrating an A/D converter in accordance with an embodiment which converts a signal from an image sensor into a digital value having N+M bits.

FIG. 1 is a diagram schematically illustrating an A/D converter in accordance with an embodiment which converts a signal from an image sensor into a digital value of N+M bits (where N is 2 or greater, M is 2 or greater). A one-dimensional array of such A/D converters 101 is arranged in a column of the image sensor. The A/D converter 101 in the array is connected to a column line COL of the image sensor and processes a pixel circuit connected to the column line COL. The A/D converter 101 comprises a first cyclic A/D converter circuit 103 and an A/D converter circuit 105. The A/D converter 101 may include a record circuit 107 which stores results of conversions from the A/D converter circuits 103, 105. The record circuit 107 includes an upper bit storage circuit 107a for storing upper bits and a lower bit storage circuit 107b for storing lower bits, for example. The cyclic A/D converter circuit 103 receives an analog value SA and generates a first digital value SD1 having upper N bits indicating the analog value SA and a residue value RD. The A/D converter circuit 105 receives the residue value RD and generates a second digital value SD2 having lower M bits indicating the residue value RD. The first cyclic A/D converter circuit 103 includes a sub A/D converter circuit 27, a logic circuit 29, a D/A converter circuit 21, and an arithmetic unit 35. For each cycle, the sub A/D converter circuit 27 generates a part of the first digital value having N bits, i.e., a digital value D having N1 bits (where N1<N). FIG. 1 illustrates a functional block for the first cyclic A/D converter circuit 103. The logic circuit 29 receives the digital value D from the sub A/D converter circuit 27. The D/A converter circuit 33 generates a D/A-converted value SDA corresponding to the signal from the logic circuit 29. The arithmetic unit 35 includes an input 35a, an output 35b, and an arithmetic section 35c. The output 35b is connected to the input 35a through a feedback path FB for a cyclic A/D conversion. In the arithmetic unit 35, the output 35b provides the final residue value RD. The input 35a receives the current residue value RD or analog value SA for the next cycle. The analog value SA is fed to the input 35a through a switch $\phi_S$. The current residue value RD is fed to the input 35a through a switch $\phi_3$ on the feedback path FB. The switches $\phi_S$ and $\phi_3$ are never turned on at the same time. The switches in the A/D converter 101 are constituted by MIS transistors, for example. The arithmetic unit 35 amplifies the input value at the input 35a, generates a difference between thus amplified input value and the D/A-converted value SDA, and feeds the difference to the output 35b and the feedback path FB. The arithmetic unit 35 performs actions for the cyclic A/D conversion, i.e., amplification, difference generation corresponding to the D/A-converted value SDA, and sampling and holding actions.

The A/D converter 101 generates upper N bits by L cycles in the first cyclic A/D converter circuit 103. The A/D converter circuit 103 at the first stage can provide the $2^L$-times-amplified residue component by L cyclic actions in the cyclic A/D conversion. Thus amplified residue component is fed to the A/D converter circuit 105 for the lower bit. This can lower the conversion accuracy in the A/D converter circuit 105 at the second stage to $\frac{1}{2^L}$ that in the A/D converter circuit 103 at the first stage. Therefore, an A/D converter circuit with an accuracy lower than that of the A/D converter circuit 103 at the first stage can be employed as the A/D converter circuit 105 at the second stage.

In the A/D converter 101, the A/D converter circuit 105 may perform any of cyclic, integrating, and successive approximation A/D conversions. Since the A/D converter circuit 103 at the first stage performs the cyclic A/D conversion, the accuracy required for the A/D conversion at the second stage can be made lower than that at the first stage in the A/D converter 101.

The A/D converter circuit 105 at the second stage holds the residue value RD and generates a second digital value SD2 having M bits. After feeding the residue value RD to the A/D converter circuit 105, the first cyclic A/D converter circuit 103 can perform the cyclic A/D conversion of the next analog signal. Since the A/D converter circuit 105 at the second stage holds the residue value RD in the A/D converter 101, the A/D converter circuit 103 at the first stage can thereafter process the next signal from the image sensor, thereby providing pipeline processing. The integrating A/D converter circuit and successive approximation A/D converter circuit in the A/D converter circuit 105 at the second stage may include a sample and hold circuit, for example.

The two-stage A/D conversion mentioned above yields a partial bit string having N bits of the A/D converter circuit 103 on the upper digit side and a partial bit string having M bits of the A/D converter circuit 105 on the lower digit side. A data converter circuit 109 generates a digital signal having M+N bits from these bit strings.

Figure 2:
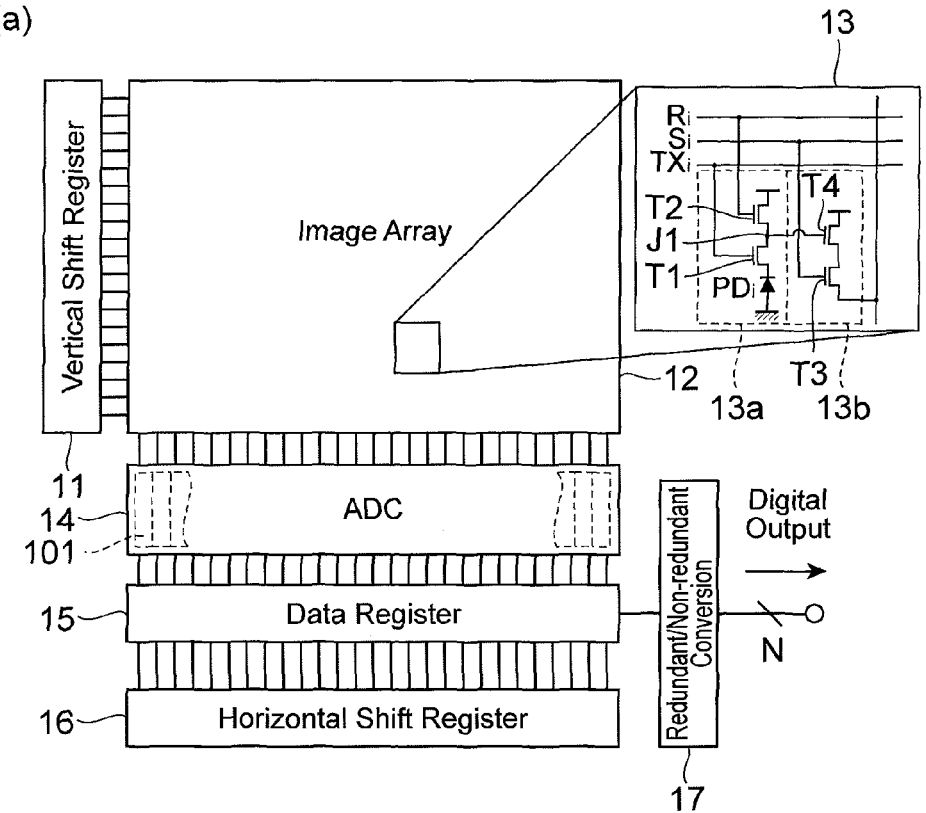
FIG. 2 is a set of diagrams schematically illustrating a circuit block of a CMOS image sensor circuit including the A/D converter depicted in FIG. 1 and an example of A/D conversion characteristics at the first stage.
Figure 2:
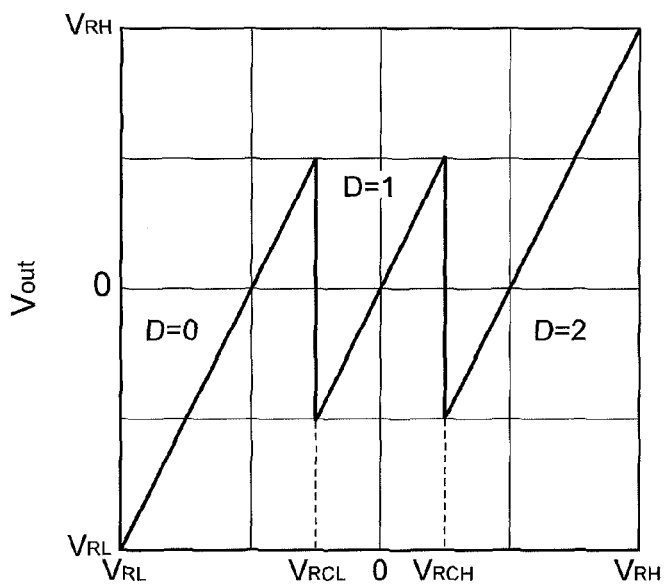

FIG. 2 is a diagram schematically illustrating a circuit block of a CMOS image sensor circuit including the A/D converter depicted in FIG. 1. A vertical shift register 11 provides control signals Ri, Si, TXi to be fed to pixels 13 constituting an image array 12 and transfers signals resulting from photoinduced charges obtained in the respective pixels 13 to an array 14 of the cyclic A/D converters 103. The array 14 includes a plurality of basic circuits each illustrated in FIG. 1 and can process the signals from the respective pixels 13 in parallel. The results of A/D conversion per 1H are stored into a data register 15 and, after the A/D conversion, read by horizontal scanning according to control signals from the horizontal shift register 16. When thus read digital value is a ternary expression, i.e., a redundant expression, the digital value in the redundant expression read by horizontal scanning is thereafter converted by a redundant expression/non-redundant expression converter circuit 17 into a binary number in a non-redundant expression.

Referring to part (a) of FIG. 2, the A/D converter circuit 101 is used in an image sensor circuit including pixels arranged in an array. Each pixel 13 includes a sensor circuit 13a containing a photodiode PDi and an amplifier circuit 13b for amplifying a sensor signal from the sensor circuit 13a. The pixel 13 initializes its inner state in response to a reset signal. After the initialization, the pixel 13 provides an electric signal corresponding to the light received by the photodiode PDi. The electric signal includes not only a significant signal component but also a noise component such as a reset noise. Each pixel 13 comprises the photodiode PDi for converting light into a charge and some MOS transistors T1 to T4. The charge is moved, initialized, and selected under the control of the transistors T1, T2, and T3 responding to the control signals TXi, Ri, and Si, respectively. The transistor T4 responds to the potential at a junction J1 between the transistors T1 and T2. Each pixel 13 generates a reset noise in response to a reset action. The voltage issued from the pixel 13 includes a fixed pattern noise specific to each pixel. Random noises are generated by devices and the like connected to the input of the A/D converter 101. The pixels 13 are arranged in a matrix, while signals from the pixel 13, which are a signal at a first signal level including a noise component and a signal at a second signal level including a signal component superposed on the noise component (signals VR, VS illustrated in FIG. 6), are transferred to the array 14 of A/D converters 101 through a signal line connected to the amplifier circuit 13b.

Figure 3:
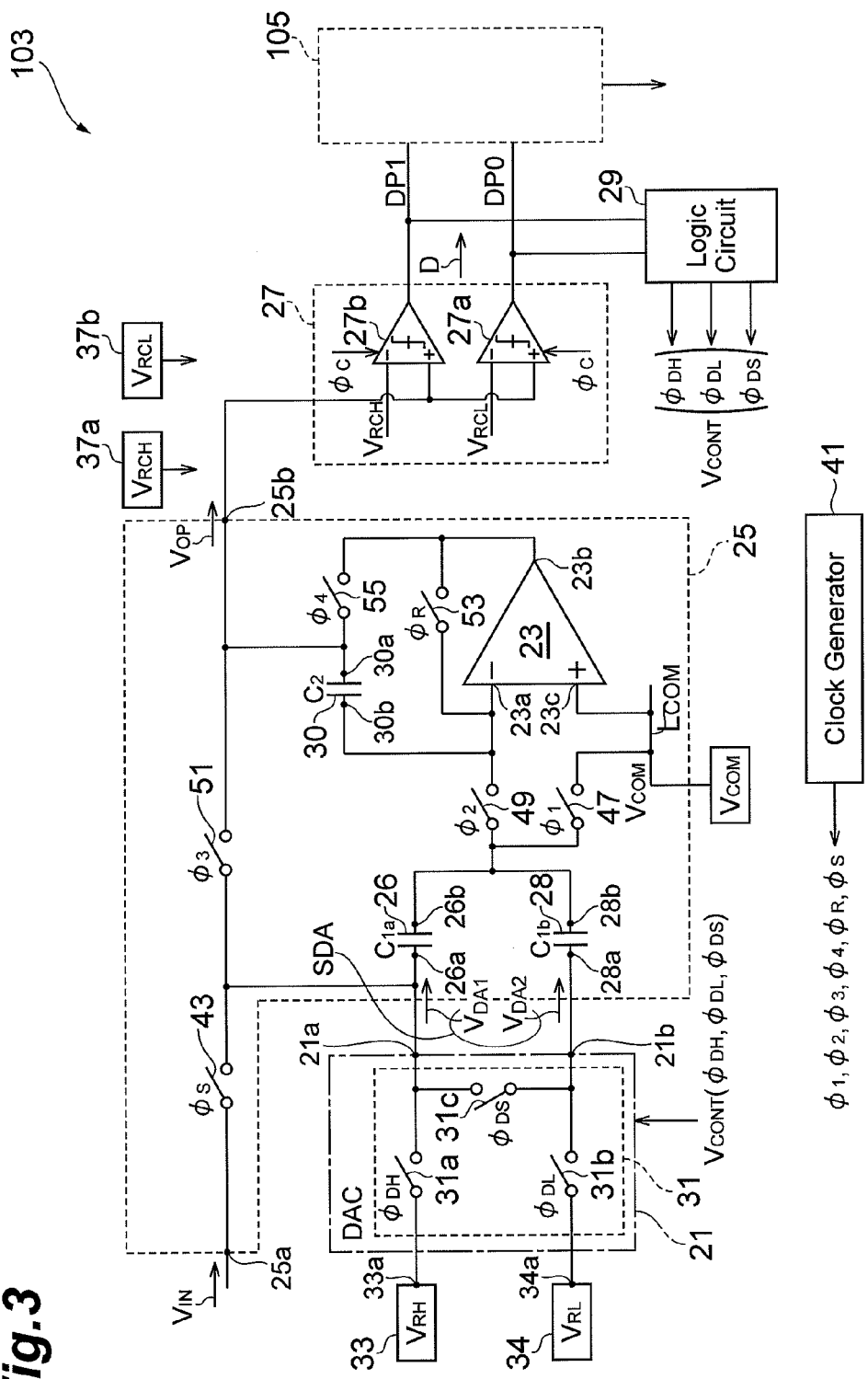
FIG. 3 is a diagram illustrating an example of the first cyclic A/D converter circuit.
Figure 4:
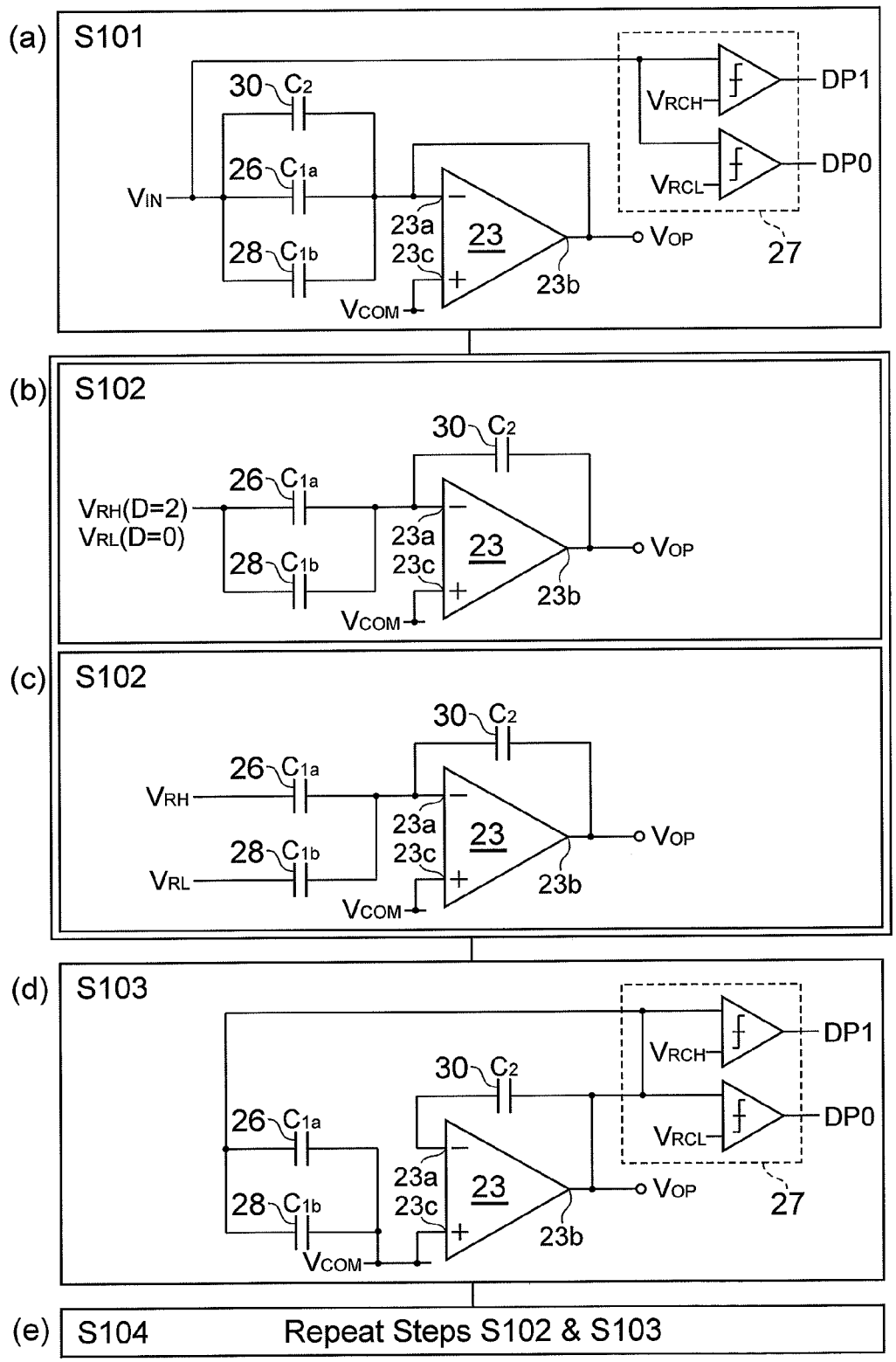
FIG. 4 is a set of diagrams schematically illustrating circuit connections in main action steps of a cyclic A/D converter depicted in FIG. 3.

FIG. 3 is a diagram illustrating an example of the first cyclic A/D converter circuit 103. FIG. 4 is a set of diagrams schematically illustrating circuit connections in main action steps of the cyclic A/D converter depicted in FIG. 3. The cyclic A/D converter circuit 103 comprises a gain stage 25, a sub A/D converter circuit 27, a logic circuit 29, and a D/A converter circuit 21. The gain stage 25 includes an input 25a for receiving an analog signal $V_{IN}$ to be converted into a digital value and an output 25b for providing an operated value per cycle (residue value per cycle) $V_{OP}$. The gain stage 25 includes a single-ended operational amplifier circuit 23 and first to third capacitors 26, 28, 30. The operational amplifier circuit 23 has a first input 23a, an output 23b, and a second input 23c, while a signal at the output 23b has a phase reversed from that of a signal given to the first input 23a. For example, the first and second inputs 23a, 23c are inverting and non-inverting input terminals, respectively, while the output 23b is a non-inverting output terminal. For example, the second input 23c of the operational amplifier circuit 23 is connected to a reference potential line $L_{COM}$ and receives a reference potential $V_{COM}$. The sub A/D converter circuit 27 generates the digital signal D in response to the signal $V_{OP}$ from the output 25b of the gain stage 25.

The A/D converter circuit 27 may include two comparators 27a, 27b, for example. The comparators 27a, 27b compare the input analog signal with their predetermined reference signals $V_{RCL}$, $V_{RCH}$ and provide respective comparison result signals DP0, DP1 as illustrated in FIG. 1. The reference signals $V_{RCL}$, $V_{RCH}$ of the A/D converter circuit 27 are provided by voltage sources 37a, 37b, respectively. The digital signal D indicates an A/D-converted value per cycle. The digital signal D has 2 bits (DP0, DP1), for example, while each bit (DP0, DP1) may take 1 or 0. Depending on combinations of the bits (DP0, DP1), the digital value per cycle has first to third values (D=0, D=1, D=2) in the cyclic A/D converter 103. The logic circuit 29 generates a control signal $V_{CONT}$ (e.g., $\phi_{DH}$, $\phi_{DL}$, $\phi_{DS}$) corresponding to the digital signal D. When necessary, the sub A/D converter circuit 27 may time-share one comparator, for example, so as to compare the operated value $V_{OP}$ with the reference signals and provide the signals DP0, DP1 indicating the results of comparisons.

The gain stage 25 may include operating and holding actions. In the operating action, the operational amplifier circuit 23 and first to third capacitors 26, 28, 30 generate the operated value $V_{OP}$. In the holding action, the operated value $V_{OP}$ is held in the first and second capacitors 26, 28.

In the cyclic A/D converter 103, the first and second capacitors 26, 28 are connected to first and second outputs 21a, 21b of the D/A converter circuit 21, respectively. In response to the control signal $V_{CONT}$, a switch circuit 31 of the D/A converter circuit 21 can feed at least one of the voltage signals $V_{RH}$, $V_{RL}$ to the first output 21a and at least one of the voltage signals $V_{RH}$, $V_{RL}$ to the second output 21b. Therefore, in the operating action, applying the voltage signals $V_{RH}$, $V_{RL}$ to one terminal of the capacitors 26, 28 in a switching manner by using the switch circuit 31 makes the gain stage 25 act as if it receives three kinds of voltage signals from the D/A converter circuit 21. Specifically, in the cyclic A/D converter 103, the D/A converter circuit 21 feeds the voltage signal $V_{RH}$ to the capacitors 26, 28 in response to the first value (D=2) of the digital signal (DP0, DP1). The D/A converter circuit 21 feeds the voltage signals $V_p$, $V_{RL}$, to the capacitors 26, 28 in response to the second value (D=1) of the digital signal (DP0, DP1). The D/A converter circuit 21 feeds the voltage signal $V_{RL}$ to the capacitors 26, 28 in response to the third value (D=0) of the digital signal (DP0, DP1). When the capacitors 26, 28 are provided with the first and second voltage signals of the D/A converter circuit, respectively, two kinds of voltage signals are synthesized through the capacitors 26, 28 in the cyclic A/D converter circuit 103.

Part (b) of FIG. 2 is a chart illustrating conversion characteristics of the operated value $V_{OP}$ and a digital value per cycle.

Depending on the digital signal, the operated value $V_{OP}$ has the following ranges:

$V_{RCL} > V_{OP}$ when $D=0$;

$V_{RCH} \geq V_{OP} \geq V_{RCL}$ when $D=1$; and $V_{OP} < V_{RCH}$ when $D=2$. (1)

By comparing the operated value $V_{OP}$ from the gain stage 25 with predetermined two reference signals, the sub A/D converter circuit 27 generates a redundant code (ternary digital signal).

The D/A converter circuit 21 feeds at least one of the first and second voltage signals $V_{RH}$, $V_{RL}$, to the gain stage 25 in response to the control signal $V_{CONT}$. For this purpose, the D/A converter circuit 21 includes the first and second outputs 21a, 21b and switch circuit 31. In response to the control signal $V_{CONT}$, the switch circuit 31 feeds one of the voltage signals $V_{RH}$, $V_{RL}$, to the first output 21a and one of the voltage signals $V_{RH}$, $V_{RL}$ to the second output 21b.

In the D/A converter circuit 21, the voltage signals $V_{RH}$, $V_{RL}$ are provided by first and second voltage sources 33, 34. The first voltage source 33 provides the voltage $V_{RH}$. The second voltage source 34 provides the voltage $V_1$. An output 33a of the first voltage source 33 is connected to the output 21a through a switch 31a within the switch circuit 31 and to the output 21b through switches 31a, 31c within the switch circuit 31. An output 34a of the second voltage source 34 is connected to the output 21a through switches 31b, 31c within the switch circuit 31 and to the output 21b through the switch 31b within the switch circuit 31. The first and second outputs 21a, 21b of the D/A converter circuit 21 are connected to respective one ends 26a, 28a of the first and second capacitors 26, 28. Since the switches 31a to 31c are opened/closed under the control of their respective control signals $\phi_{DH}$, $\phi_{DS}$, and $\phi_{DL}$ from the logic circuit 29, the values of digital signals DP0, DP1 determine which of the control signals $\phi_{DH}$, $\phi_{DS}$, and $\phi_{DL}$ becomes active.

In response to the control signal from the logic circuit 29, the D/A converter circuit 21 provides the value illustrated in FIG. 2, for example.

$V_{DA1} = V_{DA2} = V_{RH}$ is provided when the condition $D=2$ is satisfied;

$V_{DA1} = V_{RH}, V_{DA2} = V_{R1}$, are provided when the condition $D=1$ is satisfied; and $V_{DA1} = V_{DA2} = V_{RL}$ is provided when the condition $D=0$ is satisfied. Relationship (2):

The gain stage 25 includes a plurality of switches for connecting the capacitors 26, 28, 30 and the operational amplifier circuit 23. The arrangement of these switches 43, 47, 49, 51, 53, 55 illustrated in FIG. 3 is just an example. The switches 43, 47, 49, 51, 53, 55 are controlled by a clock generator 41.

The connection at step S101 in part (a) of FIG. 4 performs an initial storage action. In the initial storage action mode, the analog signal $V_{IN}$ is stored into the capacitors 26, 28, 30. For the storage, the capacitors 26, 28, 30 are connected in parallel to each other. The initial analog signal $V_{IN}$ is also fed to the sub A/D converter circuit 27. The cyclic A/D converter 103 includes a first switch means for storing the analog signal $V_{IN}$ into the capacitors 26, 28, 30. The first switch means feeds the initial analog signal $V_{IN}$ to the A/D converter circuit 27. The A/D converter circuit 27 generates the digital signal D. The logic circuit 29, which is fed with the signal D, generates the control signal $V_{CONT}$ for controlling the D/A converter circuit 21.

For storing the analog signal $V_{IN}$ into the capacitors 26, 28, 30, the terminal 26a of the capacitor 26 is connected to the input 25a through the switch 43, the terminal 28a of the capacitor 28 is connected to the input 25a through the switches 31c, 43, a terminal 30a of the capacitor 30 is connected to the input 25a through the switches 43, 51, and the reference potential is supplied to the terminals 26b, 28b of the capacitors 26, 28 through the switches 49, 53 and to the terminal 30b of the capacitor 30 through the switch 53. In the first switch means, clock signals ($\phi_{DS}=1$, $\phi_S=1$, $\phi_2=1$, $\phi_R=1$) turn on the switches 31c, 43, 49, 53, while clock signals ($\phi_1=0$, $\phi_4=0$) turn off the switches 47, 55. The terminal 30a of the capacitor 30 and the output 23b are separated from each other by the switch 55, while the output 23b is separated from the input 25a by the switch 55. When the gain stage 25 connects the input 23a and output 23b of the operational amplifier circuit 23 to each other, the reference potential $V_{COM}$ is generated at the output 23b of the operational amplifier circuit 23. In this connection, the sub A/D converter circuit 27 receives the initial analog signal $V_{IN}$ and generates the digital signal D in response to the clock $\phi_C$. Though the terminal 26a of the capacitor 26 and the terminal 28a of the capacitor 28 are connected to each other through the switch 31c, a separate switch may be provided for this connection.

At step S102 in parts (b) and (c) of FIG. 4, an operating action is performed. In the operating action mode, the gain stage 25 generates the operated value $V_{OP}$ by the operational amplifier circuit 23 and capacitors 26, 28, 30. In the operating action, the capacitor 30 is connected between the output 23b and input 23a of the operational amplifier circuit 23, while the capacitors 26, 28 are connected between the D/A converter circuit 21 and the input 23a. The cyclic A/D converter 101 includes a second switch means for the operating action. According to the value of the control signal $V_{CONT}$, the D/A converter circuit 21 feeds the voltage signal $V_{DA1}$ and/or $V_{DA2}$ to the gain stage 25. In response to the application of the voltage signal $V_{DA1}$, $V_{DA2}$, the operated value $V_{OP}$ is generated at the output 25b of the gain stage 25. The operated value $V_{OP}$ is represented by the following expressions:

$V_{OP} = (1 + C_1/C_2) \times V_{IN} - V_R$. (3)

$C_1 = C_{1a} + C_{1b}$. (4)

The value VR is determined by the voltage signals $V_{DA1}$, $V_{DA2}$ from the D/A converter circuit 21 and represented as follows:

$V_R = (C_{1a} + C_{1b}) \times V_{RH}/C_2$ when the condition $D=2$ is satisfied;

$V_R = (C_{1a} \times V_{RH} + C_{1b} \times V_{RL})/C_2$ when the condition $D=1$ is satisfied; and $V_R = (C_{1a} + C_{1b}) \times V_{RL}/C_2$ when the condition $D=0$ is satisfied. Relationship (5):

When the relationship $C_{1a} = C_{1b} = C_2/2$ is satisfied, the expression (3) and relationship (5) are rewritten as follows:

$V_{OP} 2 \times V_{IN} - V_R$. (6)

The relationship (3) is also rewritten as the following relationship (7):

$V_R = V_{RH}$ when the condition $D=2$ is satisfied;

$V_R = (V_{RH} + V_{RL})/2$ when the condition $D=1$ is satisfied; and $V_R = V_{RL}$ when the condition $D=0$ is satisfied.

That is, the D/A converter circuit 21 generates three values of $V_{RH}$, $V_{RL}$, and their midpoint voltage $(V_{RH}+V_{RL})/2$ in response to three A/D-converted values.

In this action, the linearity of the A/D conversion characteristic is not affected by shifts in absolute values of the reference voltages $V_{RH}$, $V_{RL}$, but only by the accuracy in generating the midpoint voltage. The capacity ratio accuracy of the capacitor determines the midpoint voltage. In semiconductor integrated circuits, the accuracy of capacity ratio is much higher than the accuracy of resistance ratio, so that the A/D converter 103 having high accuracy can be provided.

For generating the operated value $V_{OP}$, the terminals 26b, 26b of the capacitors 26, 28 are connected to the input 23a through the switch 49, and the terminal 30a of the capacitor 30 is connected to the output 23b through the switch 55. In the second switch means, clock signals ($\phi_2$=1, $\phi_4$=1) turn on the switches 49, 55, while clock signals ($\phi_S$=0, $\phi_1$=0, $\phi_3$=0, $\phi_R$=0) turn off the switches 43, 47, 51, 53. The terminals 26b, 28b of the capacitors 26, 28 are separated from the reference potential line $V_{COM}$ by the switch 47, while the terminals 26a, 28a of the capacitors 26, 28 are separated from the output 23b by the switch 51. The input 23a and output 23b are separated from each other by the switch 53.

At step S103 in part (d) of FIG. 4, the storage action is performed. In the storage action mode, the operated value $V_{OP}$ on the output 23b of the operational amplifier circuit 23 is stored into the first and second capacitors 26, 28. For the storage, the capacitors 26, 28 are connected in parallel to each other. The cyclic A/D converter circuit 103 includes a third switch means for storing the operated value $V_{OP}$. The third switch means feeds the operated value $V_{OP}$ as an analog signal to the A/D converter circuit 27. For storing the operated value $V_{OP}$ into the capacitors 26, 28, the terminal 26a of the capacitor 26 is connected to the output 23b through the switches 51, 55, the terminal 28a of the capacitor 28 is connected to the output 23b through the switches 31c, 51, 55, and the reference potential is fed to the terminals 26b, 28b of the capacitors 26, 28 through the switch 47. In the third switch means, clock signals ($\phi_{DS}$=1, $\phi_1$=1, $\phi_3$=1, $\phi_4$=1) turn on the switches 31c, 47, 51, 55, while clock signals ($\phi_S$=0, $\phi_2$=0, $\phi_R$=0) turn off the switches 43, 49, 53. The terminals 26a, 28a of the capacitors 26, 28 are separated from the input 25a by the switch 43, while the terminals 26b, 28b of the capacitors 26, 28 are separated from the input 23a by the switch 49. In the operating action mode of the gain stage 25, the input 23a of the operational amplifier circuit 23 becomes the reference potential $V_{COM}$. The third switch means (switch 55 in this embodiment) also feeds the operated value $V_{OP}$ to the sub A/D converter circuit 27.

At step S104 in part (e) of FIG. 4, the steps S102 and S103 are repeated, so as to generate a digital signal string. The repetition is performed until A/D conversion results having a predetermined bit number are obtained. For example, L cycles yield a resolution substantially corresponding to L+1 bits.

The A/D converter circuit at the later stage will now be explained. As explained above, the A/D converter circuit 105 may include the integrating A/D conversion. Referring to FIG. 1 again, the A/D converter circuit (single-scope A/D converter circuit in this embodiment) 105 will be explained. The single-scope A/D converter circuit includes a ramp signal generator circuit 61, a comparator 63, a Gray code counter 65, and a data latch 67. The data latch 67 receives a count value from the Gray code counter 65. The comparator 63 has an input 63a for receiving the final residue value RD of the A/D converter circuit 103 at the first stage, an input 63b for receiving a ramp signal $V_{RAMP}$ from the ramp signal generator circuit 61, and an output 63c for providing the result of comparison of these signals. The comparator 63 compares the residue value RD with the ramp signal $V_{RAMP}$ and feeds a determination signal to a storage control input LOAD of the data latch 67. In response to this latch signal, the data latch 67 latches the Gray code count value at that time. Thus latched Gray code count value represents the A/D-converted value on the lower digit side.

Figure 5:
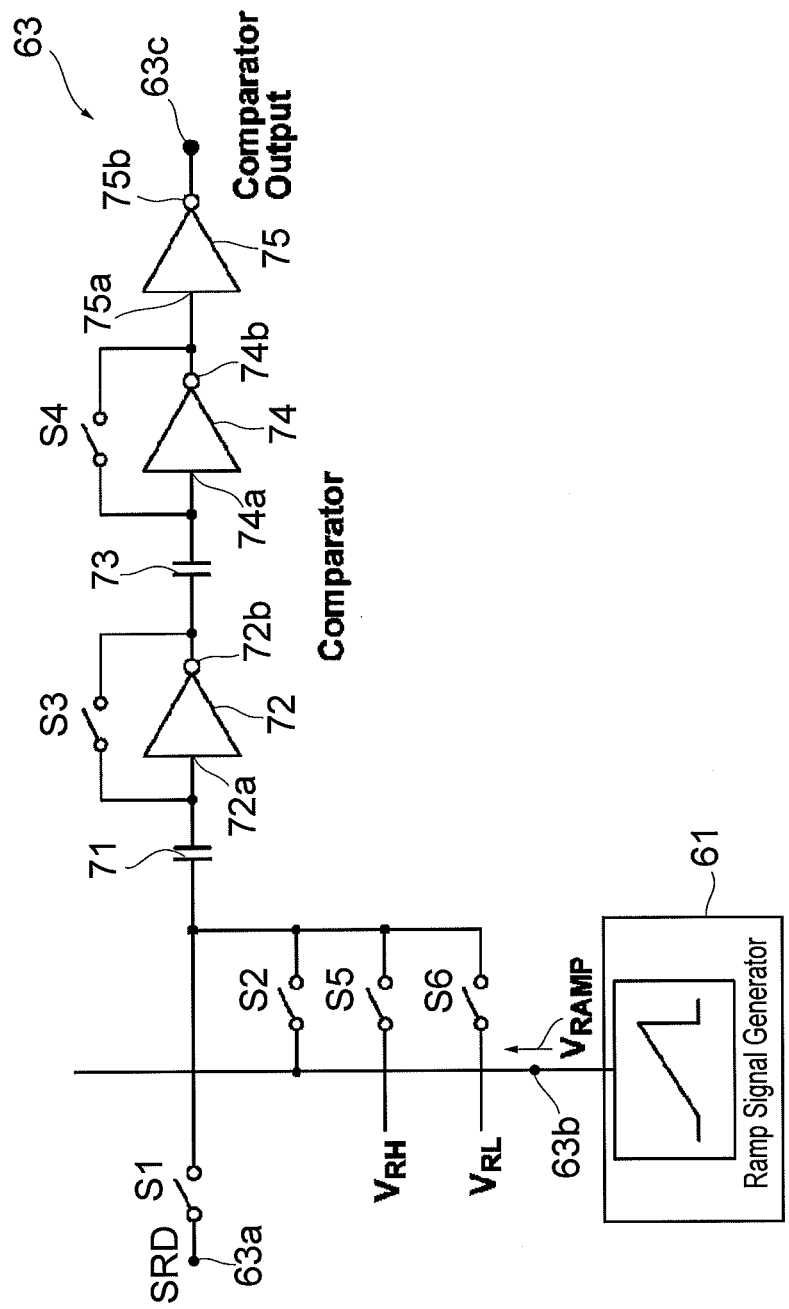
FIG. 5 is a diagram schematically illustrating a comparator of a single-scope A/D converter circuit.

As illustrated in FIG. 5, the comparator 63 includes capacitors 71, 73 and inverting amplifiers 72, 74, 75, which are connected in series in the order of the devices 71 to 75. A switch S3 is connected to the input 72a and output 72b of the inverting amplifier 72, while a switch S4 is connected to the input 73a and output 73b of the inverting amplifier 73. One end of the capacitor 71 is connected to the input 63a through a switch S1, while the output 75b of the inverting amplifier 75 is connected to the output 63c. The input 75a of the inverting amplifier 75 is connected to the output 74b. One end of the capacitor 71 is connected to the ramp signal generator circuit 61 through a switch S2 and receives the signals $V_{RH}$, $V_{RL}$ through switches S5, S6, respectively. For example, MIS transistors can be used as these switches.

Actions of the single-slope A/D converter circuit will now be explained. First, the switch S1 is turned on, so as to receive the final residue value RD from the input 63a of the comparator 63, thereby sampling comparison levels of the comparator. While this sampling is performed by initially turning on the switches S3, S4 and then turning them off, it will be preferred if the switch S3 is turned off slightly earlier than the switch S4 in order to reduce the error occurring from the charge injected by the switch S3. Thereafter, the switch S2 is turned on, so as to connect with the ramp signal generator 61. When the ramp signal $V_{RAMP}$ changes such as to exceed the residue value RD, the comparator output 63c is inverted, at which the time is counted by using a counter, so as to obtain the A/D-converted value on the lower digit side. For this purpose, the Gray code counter 65 is actuated, whereby the content of the data latch 67 changes in response to the output of the counter. Since the output 63c of the comparator 63 is connected to the control input LOAD of the data latch, the inversion of the output value of the comparator 63 allows the output of the counter 65 to be stored into the data latch.

For normalizing the count number, the reference signals $V_{RH}$ and $V_{RL}$ are fed to the comparator 63 in sequence through the switches S5 and S6, respectively, so as to perform A/D conversions similarly. These A/D conversions may be performed during a period when the image sensor is not in action or a vertical blanking period of the image sensor. Codes NS, NH, and NL are generated for the residue value RD, reference signal $V_{RH}$, and reference signal $V_{RL}$, respectively.

$$NF=(NS-NL)/(NH-NS).$$

It indicates the normalized A/D-converted value. Since this NF ideally takes values from 0 to 1, a high-resolution output is obtained by combining the A/D-converted value on the lower digit side representing it by M bits and the cyclic A/D-converted value on the upper digit side.

When the A/D converter circuit 105 at the second stage performs the single-slope A/D conversion, the A/D conversion having a favorable linearity can be provided. The single-slope A/D converter circuit is advantageous in that its circuit structure is very simple, but necessitates a long conversion time for attaining a high resolution. The A/D converter circuit 103 at the first stage performs the cyclic A/D conversion. Therefore, the resolution required for the A/D conversion at the second stage can be made lower than that at the first stage.

This allows the A/D converter circuit at the second stage to act at high speed, whereby advantages of the single-slope A/D conversion can be utilized.

The ramp signal generator circuit 61 may be provided for each column. This A/D converter can prevent ramp waveforms at the right and left ends of columns from temporally shifting from each other. The ramp signal generator circuit 61 may also be provided in common for all the columns of the image sensor. This A/D converter can be achieved in a small area.

Figure 6:
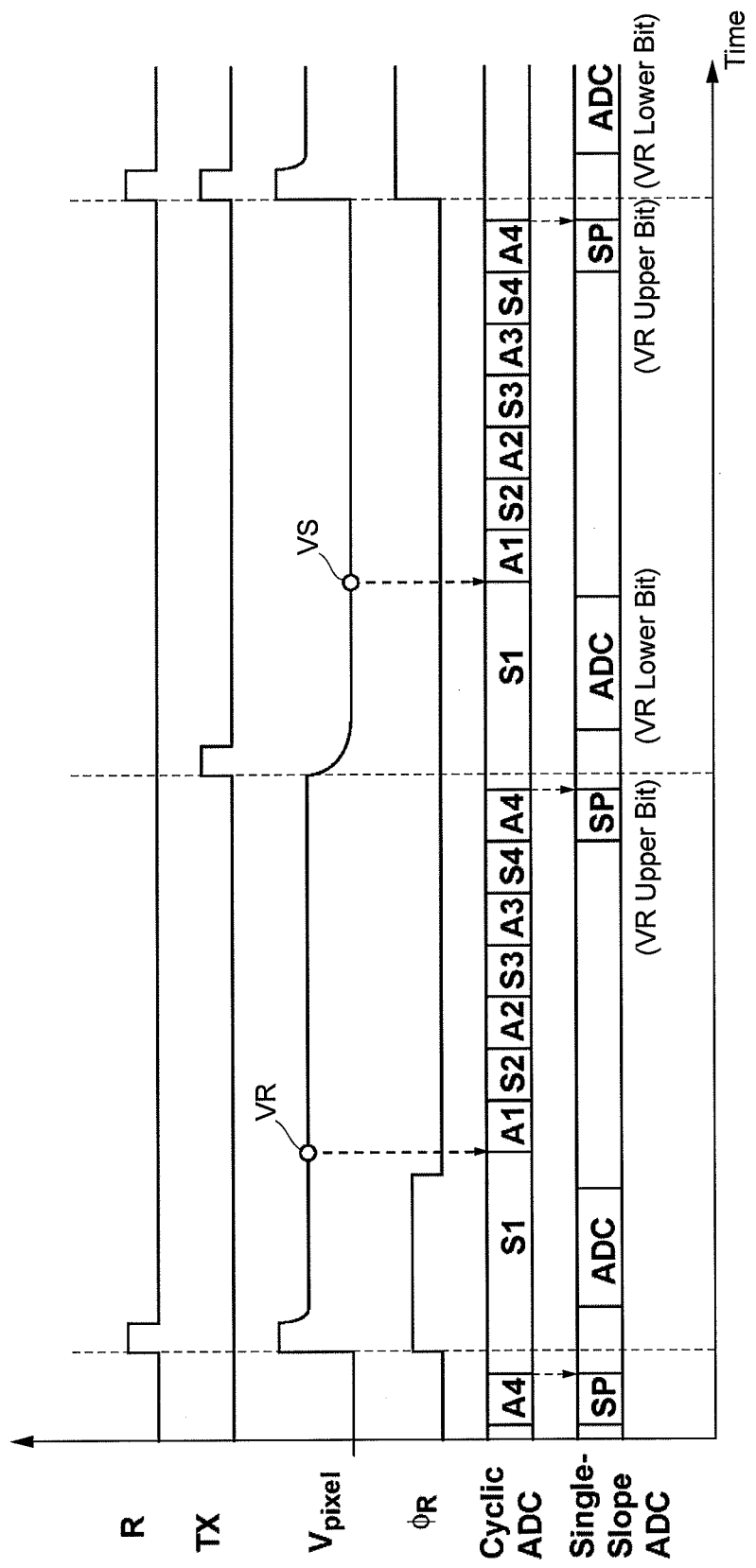
FIG. 6 is a diagram schematically illustrating a timing chart of an A/D converter including a combination of a cyclic A/D converter circuit and a single-scope A/D converter circuit.

FIG. 6 is a diagram schematically illustrating a timing chart of an A/D converter including a combination of a cyclic A/D converter circuit and a single-scope A/D converter circuit. The action illustrated in FIG. 6 performs 4 cycles in the cyclic A/D conversion. First, for the A/D conversion at the reset level of the pixel 13, the control signal $\phi_S$ turns the switch on, so as to perform sampling of the reset level VR (S1 in FIG. 6). Thus sampled signal is A/D-converted (A1 in FIG. 6), so as to generate a partially A/D-converted value and a first residue value. Then, the control signal $\phi_3$ turns the switch on, so as to perform sampling of the first residue value (S2 in FIG. 6). Thus sampled signal is A/D-converted (A2 in FIG. 6), so as to generate a partially A/D-converted value and a second residue value. Subsequently, samplings (S3 and S4 in FIG. 6) and A/D conversions (A3 and A4 in FIG. 6) are performed, so as to yield upper bits having 4 digits in total. The residue value in the final cycle (A4) is sampled into the single-slope A/D converter circuit 105 during a sampling period SP for the A/D converter circuit on the lower digit side. Thereafter, during a period ADC, the single-slope A/D conversion on the lower digit side is performed. An interval is provided between the periods SP and ADC so as to prevent the A/D conversion on the lower digit side from being carried out during a period in which a transfer gate signal TX of the pixel changes. When such is unnecessary, the A/D conversion on the lower digit side may be started without the interval.

After the residue value is once sampled from the cyclic A/D converter circuit 103 into the comparator of the single-slope A/D converter circuit, sampling for a cyclic action for the next signal VS in the A/D converter circuit on the upper digit side can be started. Here, during when the A/D converter circuit 105 on the lower digit side performs the single-slope A/D conversion for the reset level VR, the transistor T1 within the pixel 13 is actuated, so as to feed the signal level VS to the column line and sample this signal into the A/D converter circuit 103 on the upper digit side in parallel with each other. Thereafter, the cyclic A/D conversion of the signal level VS is performed. The single-slope A/D conversion of the reset level VR has been completed before accomplishing the cyclic A/D conversion of the signal level VS. Therefore, the residue value of the signal level VS is sampled during the period SP of the single-slope A/D conversion. This A/D conversion is performed during a period in which the reset level VR of the next pixel circuit is sampled into the cyclic converter circuit in the next cycle.

Thus cascading the cyclic A/D converter circuit and the single-slope A/D converter circuit to each other allows the two A/D converter circuits 103, 105 to act in parallel with each other at the same time, so as to attain higher speed in the A/D conversion. When it takes a long time for the single-slope A/D conversion, the A/D conversion on the lower digit side may be performed during the A/D conversion period A1 and thereafter in addition to the cyclic A/D conversion period S1.

Figure 7:
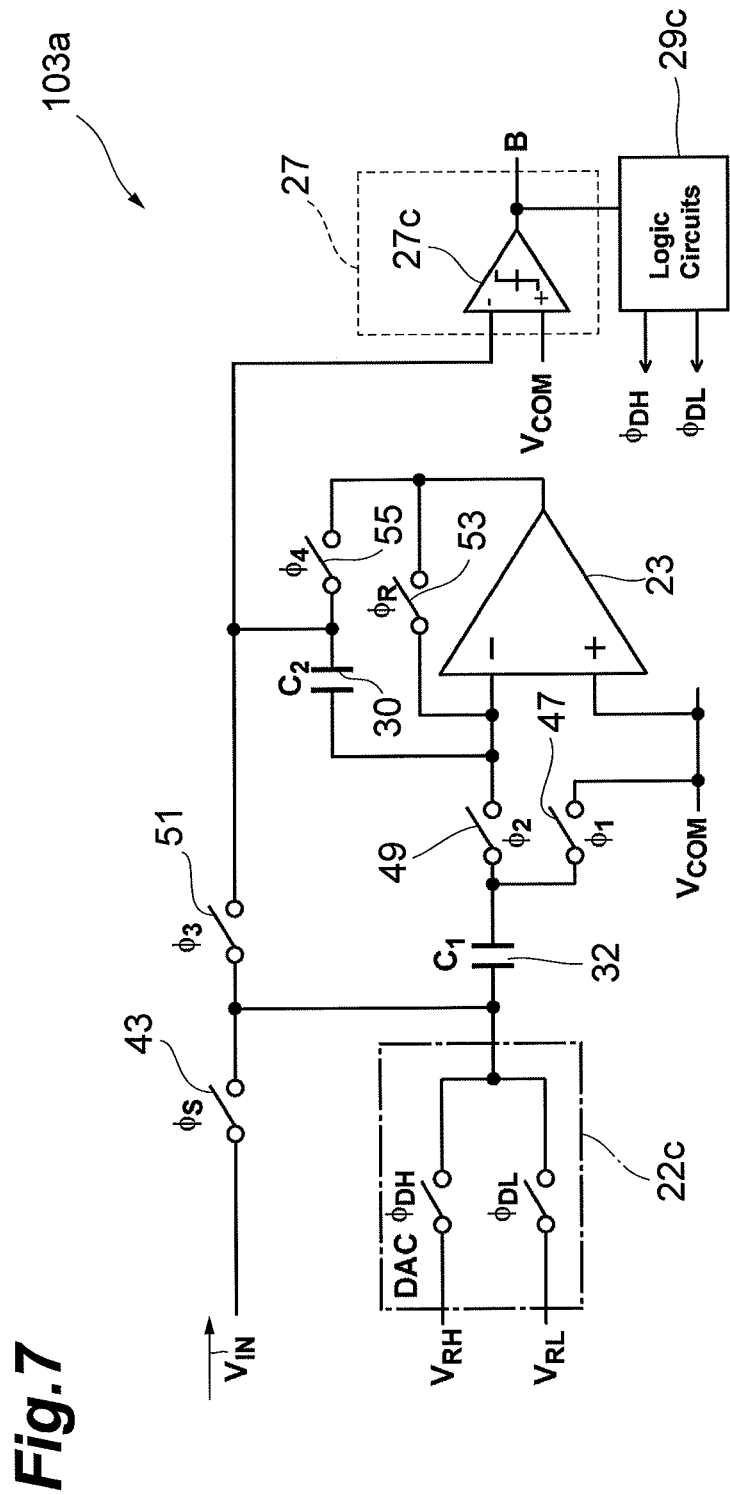
FIG. 7 is a diagram schematically illustrating a cyclic A/D converter circuit which generates a partially A/D-converted value by using a single comparator.

The cyclic A/D converter circuit illustrated in FIG. 3 generates a ternary redundant code for each cycle of the A/D conversion output. While this generates no errors resulting from a relatively large input offset, if any, inherent in the comparators 27a, 27b in use, the sub A/D converter circuit 27 requires two comparators. Since this scheme (1.5-bit scheme) is a redundant expression, the storage circuit 107 requires a 2-bit storage circuit for each cycle. For reducing the circuit scale on the upper digit side, the cyclic A/D converter circuit may be used for generating a non-redundant binary code by performing the A/D conversion in a 1-bit scheme. An embodiment of the A/D converter may use a cyclic A/D converter circuit 103a illustrated in FIG. 7 in place of the cyclic A/D converter circuit 103. The cyclic A/D converter circuit 103a has the conversion characteristic illustrated in part (a) of FIG. 8 when its comparator 27c has no offset. The cyclic A/D converter circuit 103a includes a sub A/D converter circuit containing the single comparator 27c, a D/A converter circuit 22c, and a logic circuit 29c for generating a control signal for the D/A converter circuit 22c from a 1-bit partially converted value.

The cyclic A/D converter used in this scheme has a circuit structure simpler than that illustrated in FIG. 3. Its sub A/D converter circuit includes the single comparator 27c, the D/A converter circuit 22c is constituted by a smaller number of switches, and the arithmetic unit includes capacitors 30, 32. The capacitor 30 has a capacitance C2, while the capacitor 32 has a capacitance C1 (=$C_{1a}$+$C_{1b}$), whereby the total number of capacitors can be reduced.

Figure 8:
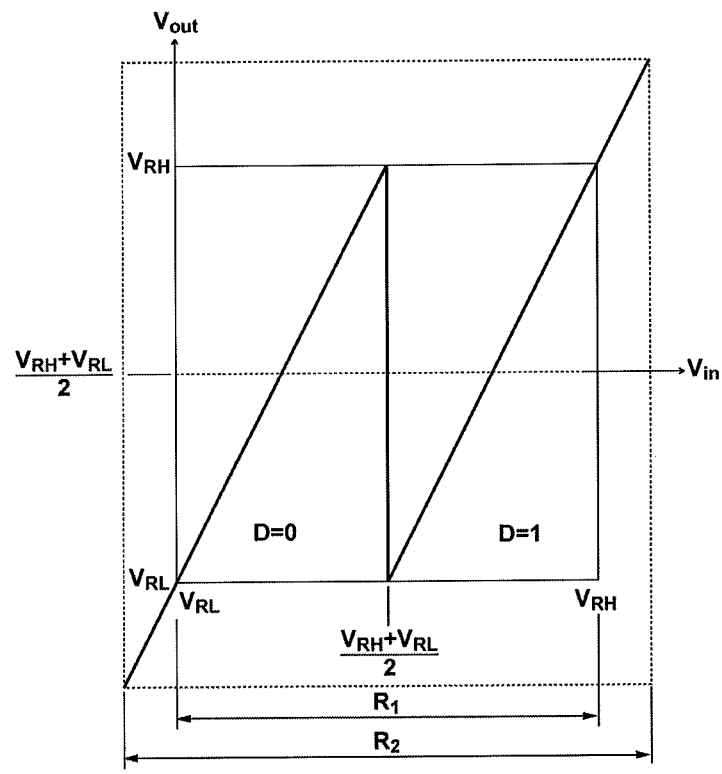
FIG. 8 is a set of charts illustrating conversion characteristics (with and without offset) in the cyclic A/D converter circuit that generates a partially A/D-converted value by using a single comparator.
Figure 8:
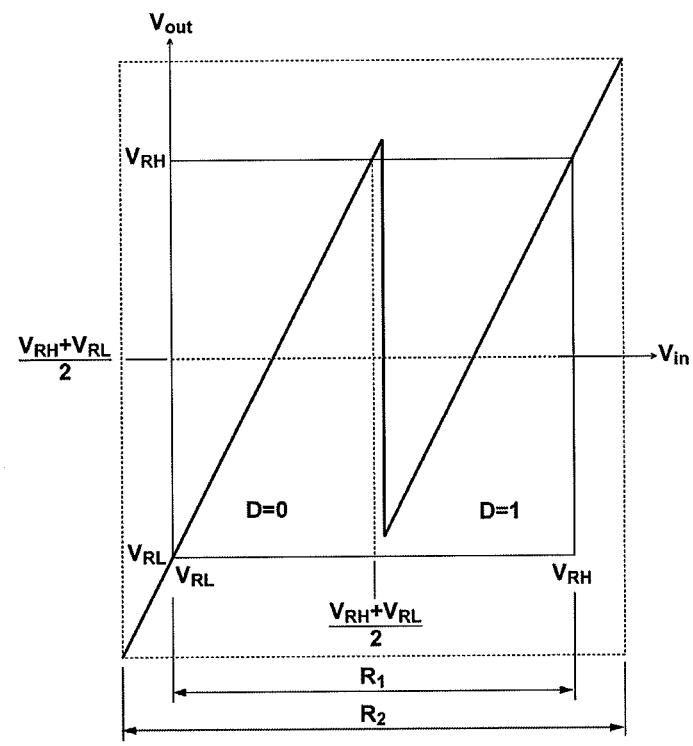

In this 1-bit scheme, the A/D-converted value incurs a large nonlinear error when an offset occurs in the comparator 27c as illustrated in part (b) of FIG. 8. For reducing the error, an A/D converter circuit having an over-range conversion characteristic may be used on the lower digit side. When an A/D converter circuit which generates a converted value linearly in response to an input signal exceeding the range of the reference voltage (the range from $V_{RL}$ to $V_{RH}$) is used, i.e., when the input range of the A/D converter circuit 105 at the later stage is so wide as to cover the over-range area, the error resulting from the offset voltage of the single comparator 27c in the sub A/D converter circuit 27 can be reduced.

When the input voltage of the sub A/D converter circuit is a value near ($V_{RL}$+$V_{RH}$)/2 in the case where the single comparator 27c has an offset, however, the output voltage of the sub A/D converter circuit exceeds the range from $V_{RL}$ to $V_{RH}$ as illustrated in part (b) of FIG. 8. As a result, the input value to the next stage also exceeds the range from $V_{RL}$ to $V_{RH}$. When the input range of the A/D conversion characteristic on the lower digit side can generate a linear operation result in a voltage range $R_2$ wider than a voltage range $R_1$ from $V_{RL}$ to $V_{RH}$, even if the comparator 27c has some offset, the error resulting from the offset (offset error) can be prevented from affecting the A/D-converted value on the lower digit side. The single-slope A/D conversion in the over-range area is performed by changing the reference values $V_{RH}$, $V_{RL}$ illustrated in FIG. 5, i.e., by setting a new reference value such that $R_2 > R_1 = V_{RL} - V_{RH}$.

The offset error is amplified by an amplification factor of the capacitor ratio (2×) for each cycle repeated in the A/D conversion on the upper digit side. In N cycles, the value of the offset error (offset voltage $V_{OFF}$) permissible in the comparator of the sub A/D converter circuit is represented by $$\mathrm{ABS}(V_{OFF}) = (R_2 - R_1)/2^{N+1}$$

where ABS indicates the absolute value. When ($R_2$−$R_1$)=0.5 V, for example, the permissible value of the offset voltage is required to be 15.5 mV or less in 4 cycles.

Figure 9:
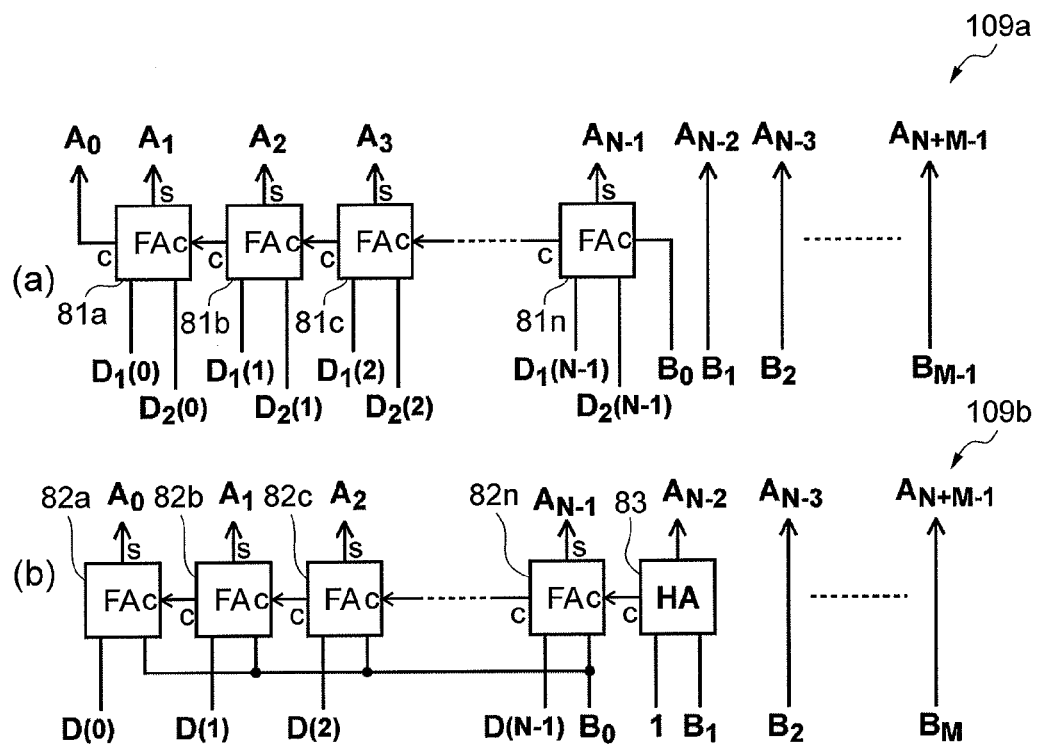
FIG. 9 is a set of diagrams schematically illustrating data conversion circuits.

The data converter circuit will now be explained. In FIG. 1, the data converter circuit 109 receives bit strings from the storage circuit 107. The partial bit string having the N bits from the A/D converter circuit 103 on the upper digit side and the partial bit string having the M bits from the A/D converter circuit 105 on the lower digit side are fed to the data converter circuit 109. Part (a) of FIG. 9 illustrates a data converter circuit 109a for generating a digital signal having M+N bits from the N-bit redundant partial bit string and the M-bit partial bit string. The input analog value is represented as a digital value $X_0$ having N+M bits as follows:

$$X_0 = D_0 \times 2^{-1} + D_1 \times 2^{-2} + D_2 \times 2^{-3} + \ldots + D_{N-1} \times 2^{-(N-1)} + X_N \times 2^{-(N-1)}$$

where $X_N = B_0 B_1 \times 2^{-1} + B_2 \times 2^{-2} + \ldots + B_{M-1} \times 2^{-(M-1)}$.

$X_i$ (where i=1, 2, 3, ..., N−1) takes a value within the range from 0 to 2. The value generated in each cycle at the earlier stage is referred to as $D_i$ (where i=1, 2, 3, ..., N−1). $D_i$ (where i=1, 2, 3, ..., N−1) takes any of values 0, 1, and 2. The value obtained by the A/D conversion at the later stage is referred to as $B_j$ (where j=1, 2, 3, ..., M−1). $B_j$ (where j=1, 2, 3, ..., M−1) takes any of values 0 and 1. The 2-bit signals $D_0$=(D1(0), D2(0)), $D_1$=(D1(1), D2(1)), ..., $D_{N-1}$=(D1(N−1), D2(N−1)) indicate partially converted values. The data converter circuit 109a includes n full adders 81a, 81b, 81c, ..., 81n. Each of the full adders 81a to 81n has two inputs for receiving the partial bit strings D1(i), D2(i) (where i=0 to N−1) in its corresponding cycle and generates a sum s and a carry c in response to two sums and a carry input. The array of full adders generates signals ($A_0$, $A_1$, $A_2$, $A_3$, ..., $A_{N-1}$) indicating the converted bit string. The full adder 81a generates a bit string ($A_0$, $A_1$). The bit $A_0$ is an output of the carry c, while the bit $A_1$ is an output of the sum s. The carry signal propagates in the direction from the full adder 81n to the full adder 81a. The full adder 81n receives the values to be added D1 (N−1), D2(N−1) and a carry input $B_0$. The bit string $B_1$, $B_2$, ..., $B_{M-1}$ from the A/D converter circuit on the lower bit side is provided as a bit string $A_{N-2}$, $A_{N-3}$, ..., $A_{N+M-1}$ without being substantially processed by the data converter circuit 109a.

Part (b) of FIG. 9 indicates a data converter circuit 109b for generating a digital signal having M+N bits from the non-redundant partial bit string having N bits and a partial bit string having over-range M bits. After N cyclic actions, the residue value is subjected to the single-slope A/D conversion, and its output value is normalized, whereby an A/D-converted value having M bits can be obtained. The residue value $X_N$ which ranges from −0.5 to +1.5 in view of its over-range area can be represented as in the following expression when subjected to the A/D conversion processing with respect to the value within this range. Here, $D_i$ (where i=1, 2, 3, ..., N−1) generated in each cycle at the earlier stage is constituted by 1 bit.

$$X_0 = D_0 \times 2^{-1} + D_1 \times 2^{-2} + D_2 \times 2^{-3} + \ldots + X_N \times 2^{-(N-1)}.$$

$$X_N = -B_0 + (1+B_1) \times 2^{-1} + B_2 \times 2^{-2} + \ldots + B_{M-1} \times 2^{-(M-1)}.$$

$D_i$ (where i=1, 2, 3, ..., N−1) takes any of values 0 and 1. $X_i$ (where i=1, 2, 3, ..., N−1) takes a value within the range from 0 to 1. $B_j$ (where j=1, 2, 3, ..., M−1) takes any of values 0 and 1. The 1-bit components D(0), D(2), ..., D(N−1) indicate partially converted values on the upper digit side. The data converter circuit 109b includes n full adders 82a, 82b, 82c, ..., 82n and a half adder 83. One of two inputs in each of the full adders 82a, 82b, 82c, ..., 82n receives a partial bit string D(i) (where i=0 to N−1), while the other of the two inputs receives the partial bit value $B_o$ on the lower digit side. Each of the full adders 82a to 82n generates a sum s and a carry c. The array of full adders generates signals ($A_0$, $A_1$, $A_2$, $A_3$, ..., $A_{N-1}$) indicating the converted bit string. The half adder 83 receives a fixed input 1 and a partial bit value B1 on the lower digit side and generates a sum $A_{N-2}$. The remaining bit string $B_2$ to $B_{M-1}$ from the A/D converter circuit on the lower digit side is provided as a bit string $A_{N-3}$, ..., $A_{N+M-1}$ without being substantially processed by the data converter circuit 109b.

Correlated double sampling will now be explained. The cyclic A/D converter circuit 103 can perform the correlated double sampling by using an analog signal. The correlated double sampling can eliminate the component of the reset level VR from the signal level VS from the pixel 13.

Figure 10:
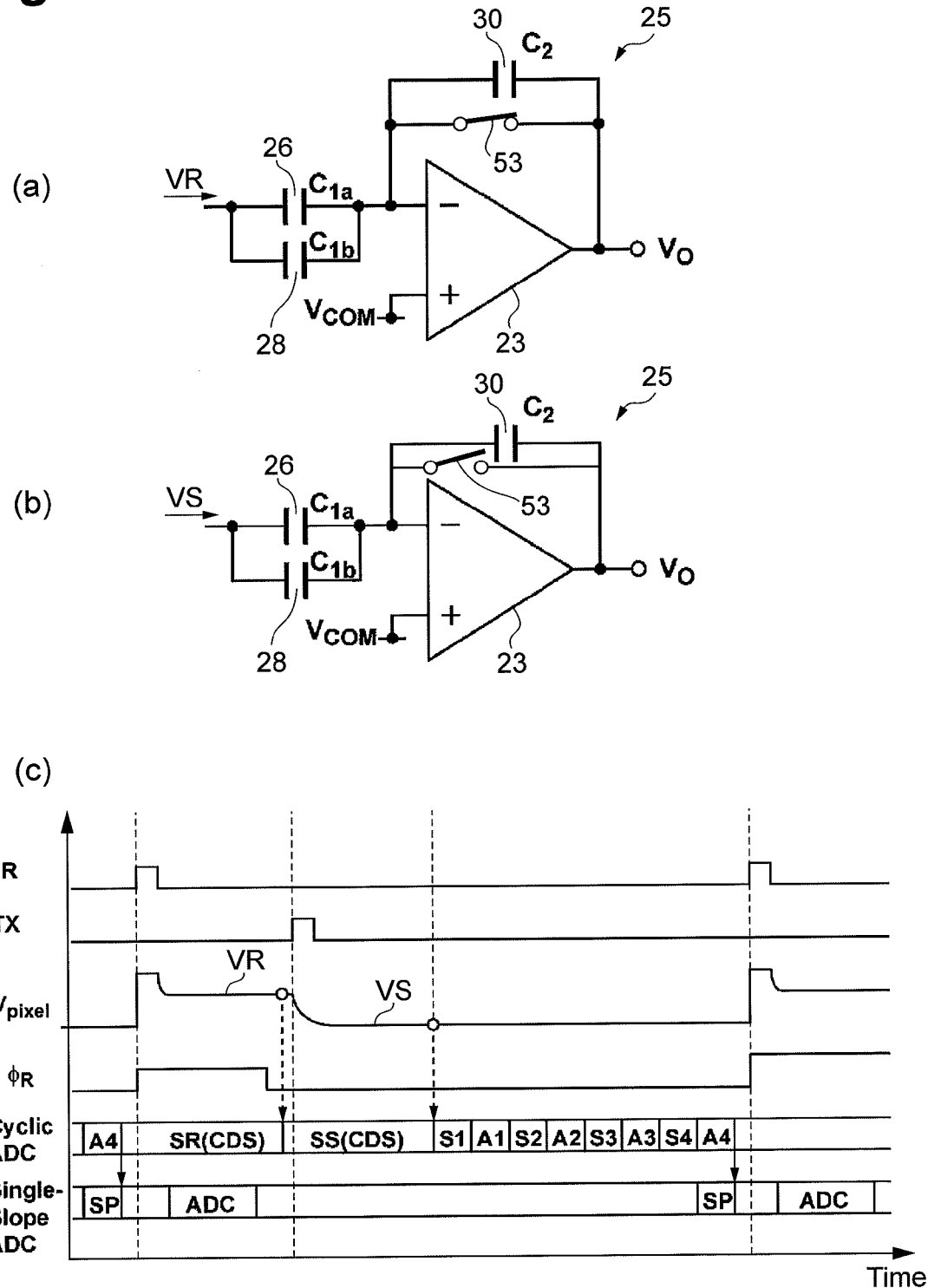
FIG. 10 is a set of diagrams illustrating circuit connections for analog processing of correlated double sampling in the cyclic A/D converter circuit at the first stage and a timing chart for the analog processing of correlated double sampling.

FIG. 10 is a set of diagrams illustrating circuit connections for analog processing of correlated double sampling and a timing chart. As illustrated in part (a) of FIG. 10, in the gain stage 25, the input 23a and output 23b of the operational amplifier circuit 23 are connected to each other by the reset switch 53, and then the reset level VR is sampled into the capacitors 26, 28 during a period SR(CDS). Subsequently, as illustrated in part (b) of FIG. 10, the reset switch 53 is opened, and then the signal level VS is sampled into the capacitors 26, 28 during a period SS(CDS). At this time, a difference value (VR−VS) is generated at the output 23b of the operational amplifier circuit 23 in the gain stage 25. This difference value can be A/D-converted by a 1-bit scheme or 1.5-bit scheme.

Referring to part (c) of FIG. 10, after the analog correlated double sampling, the cyclic A/D converter circuit 103 on the upper digit side performs four cyclic actions (S1, A1, S2, A2, S3, A3, S4, A4) and feeds the residue value in the fourth cycle to the A/D converter circuit 105 on the lower digit side during a period SP. The A/D converter circuit 105 on the lower digit side performs the A/D conversion on the lower digit side during a period ADC.

Figure 11:
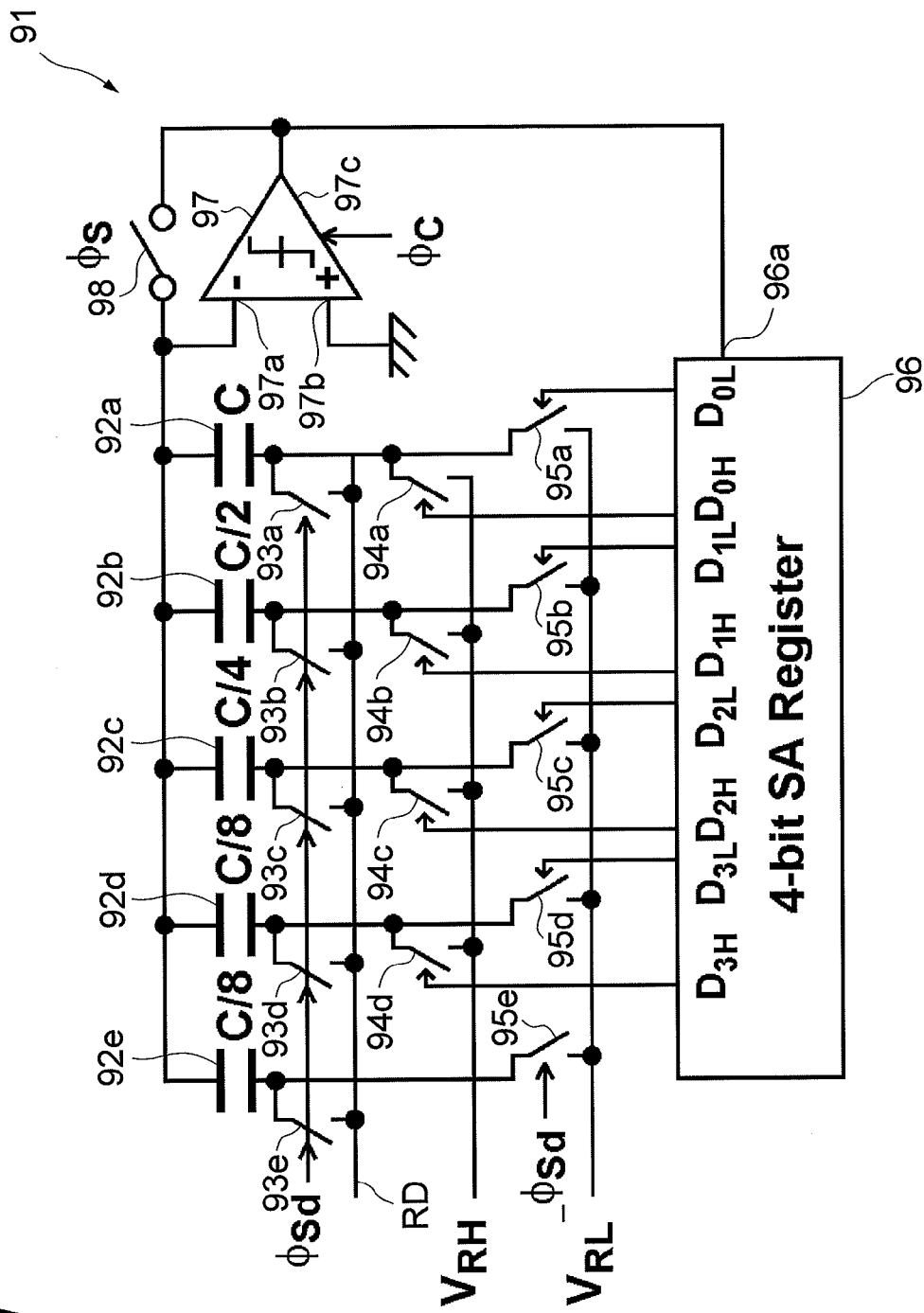
FIG. 11 is a diagram illustrating a successive approximation A/D converter at the second stage.

An embodiment which uses a successive approximation A/D converter circuit as the A/D converter circuit 105 on the lower digit side will now be explained. FIG. 11 is a diagram illustrating a successive approximation A/D converter for the A/D conversion at the second stage. This successive approximation A/D converter circuit 91 receives the residue value RD from the cyclic A/D converter circuit 103 at the first stage. The successive approximation A/D converter circuit 91 performs a 4-bit A/D conversion. The successive approximation A/D converter circuit 91 includes an array of capacitors 92a, 92b, 92c, 92d, 92e for sampling the residue value RD from the cyclic A/D converter circuit 103 at the first stage. The capacitors 92a to 92d are weighted with $\frac{1}{2}^P$ per unit capacitance C (where P=0, 1, 2, 3). The capacitor 92e has the same capacitance as that of the capacitor 92d. The sampling is performed by switches 93a, 93b, 93c, 93d, 93e connected between an input line joined to the cyclic A/D converter circuit 103 and respective one ends of the capacitors 92a, 92b, 92c, 92d, 92e. These switches 93a to 93e are under the control of a control signal $\phi_{Sd}$. Respective one ends of the capacitors 92a, 92b, 92c, 92d are connected to a reference signal $V_{RH}$ through switches 94a, 94b, 94c, 94d. Respective one ends of the capacitors 92a, 92b, 92c, 92d, 92e are connected to a reference signal $V_{RL}$ through switches 95a, 95b, 95c, 95d, 95e. The switches 95a to 95e are opened/closed under the control of an inverted signal (referred to as $\_\phi_{Sd}$) of the control signal $\phi_{Sd}$. The switches 94a to 94d are opened/closed under the control of a successive approximation register 96. The other ends of the capacitors 92a to 92e are connected to an input 97a (e.g., inverting input) of an amplifier (comparator) 97, while the other input 97b (e.g., non-inverting input) is connected to a virtual ground (e.g., GND). An output 97c (e.g., non-inverting output) of the amplifier 97 is connected to an input 96a of the successive approximation register 96, so as to control the successive approximation register 96. A switch 98 is connected between the input 97a and output 97c of the amplifier 97 and under the control of a control signal φ$_S$. The amplifier 97 acts in response to a clock φ$_C$.

Actions of the successive approximation A/D converter circuit 91 will now be explained. First, the switches 93a to 93e are closed, so as to sample the residue value RD into the array of the capacitors 92a to 92e. At this time, the input 97a of the amplifier 97 is grounded or short-circuited with the switch 98, so as to be set to a virtual ground. This virtual ground potential is set to 0 V in this embodiment. Subsequently, the switches 98, 93a to 93e (clocks φ$_S$, φ$_{Sd}$) are opened, so as to set a 4-bit code into the 4-bit successive approximation register 96. This 4-bit code actuates the capacitor array D/A converter.

Specifically, letting the 4-bit code be DD0, DD1, DD2, DD3 (where DD$_i$=0 or 1, DD0 is the MSB), D3H=1 and D3L=0 when DD3=1, for example. D3H=0 and D3L=1 when DD3=0. When sampling the residue value RD where φ$_{Sd}$=1 (ON), D3H=0 and D3L=0. The net charge on the input 97a of the amplifier 97 when sampling the residue value RD into the capacitor array equals the net charge (referred to as Q$_{NET}$) on the input 97a of the amplifier 97 at the time when the capacitor array is connected to the reference power sources V$_{RH}$, V$_{RL}$, under the control of the register 96. Using this charge conservation, the relationship among the voltage V$_S$ at the inverting input of the amplifier 97, the input voltage RD (residue), and the reference power source is represented as follows:

$$Q_{NET} = 2 \times C \times (0 - RD)$$
$$= C \times (V_S - V_{RL})/8 + C \times (V_S - DD3 \times \Delta V_R - V_{RL})/8 +$$
$$C \times (V_S - DD2 \times \Delta V_R - V_{RL})/4 + C \times$$
$$(V_S - DD1 \times \Delta V_R - V_{RL})/2 + C \times$$
$$(V_S - DD0 \times \Delta V_R - V_{RL})$$

where $\Delta V_R = V_{RH} - V_{RL}$.
This value is expressed as follows:

$$Q_{NET} = V_{RL} + (DD0 \times 2^{-1} + DD1 \times 2^{-2} + DD2 \times 2^{-3} + DD3 \times 2^{-4}) \times \Delta V_R - RD.$$

This indicates that the potential V$_S$ on the input of the amplifier 97 is determined by the difference between the input voltage RD and the output of the 4-bit capacitor array D/A converter circuit. The successive approximation register 96 is set such that the resolution improves in increments of 1 bit as it advances actions. For example, (DD0, DD1, DD2, DD3)= (1, 0, 0, 0). Here, the input value V$_{in}$ (e.g., RD) is compared with V$_{RL}$+0.5×ΔV$_R$=(V$_{RL}$+V$_{RH}$)/2. That is, assuming that the A/D conversion ranges from the reference value V$_{RH}$ to V$_{RL}$, its center value is compared with the input value V$_{in}$. If the input value is greater than (V$_{RL}$+V$_{RH}$)/2, it is determined that D0=1. If not, D0 is determined as D0=0. Next, if D0=1, it is assumed that (DD0, DD1, DD2, DD3)=(1, 1, 0, 0) at the second step. As a consequence, the input value is compared with V$_{RL}$+0.75×ΔV$_R$=(0.25×V$_{RL}$+0.75×V$_{RH}$), so as to determine the second bit. Repeating such an action performs successive approximation A/D conversion with a 4-bit resolution.

When the A/D converter circuit 105 at the second stage performs the successive approximation A/D conversion, the resolution required for this successive approximation A/D converter circuit is not high. This allows the A/D converter circuit at the second stage to have a small circuit scale and utilize advantages of the successive approximation. In general, the number of components (e.g., resistors and capacitors) constituting the A/D converter circuit increases exponentially in order for the successive approximation A/D converter circuit to attain a high resolution. While the A/D converter circuit 105 at the second stage performs the successive approximation A/D conversion, no A/D converter circuit having high resolution is required therefor.

The over-range scheme can also be employed when the A/D converter circuit 105 at the second stage performs the successive approximation A/D conversion. In this scheme, the reference signal in the A/D converter circuit 91 is changed such that R2>R1=V$_{RH}$-V$_{RL}$ for the over-range area.

The next embodiment provides separate cyclic A/D converter circuits for upper and lower digits, so as to perform a pipeline action, thereby making it possible to accelerate the conversion speed and cut down the power consumption. Since the A/D converter circuit at the first stage performs the cyclic A/D conversion when the A/D converter circuit at the second stage performs the cyclic A/D conversion, no high conversion accuracy is required for the cyclic A/D converter circuit at the second stage. Therefore, the A/D converter circuit at the second stage can be constructed by smaller capacitors such as ½$^L$-size capacitors, for example, and/or smaller-size transistors as compared with those in the cyclic A/D converter circuit at the first stage, and can greatly cut down its power consumption.

Figure 12:
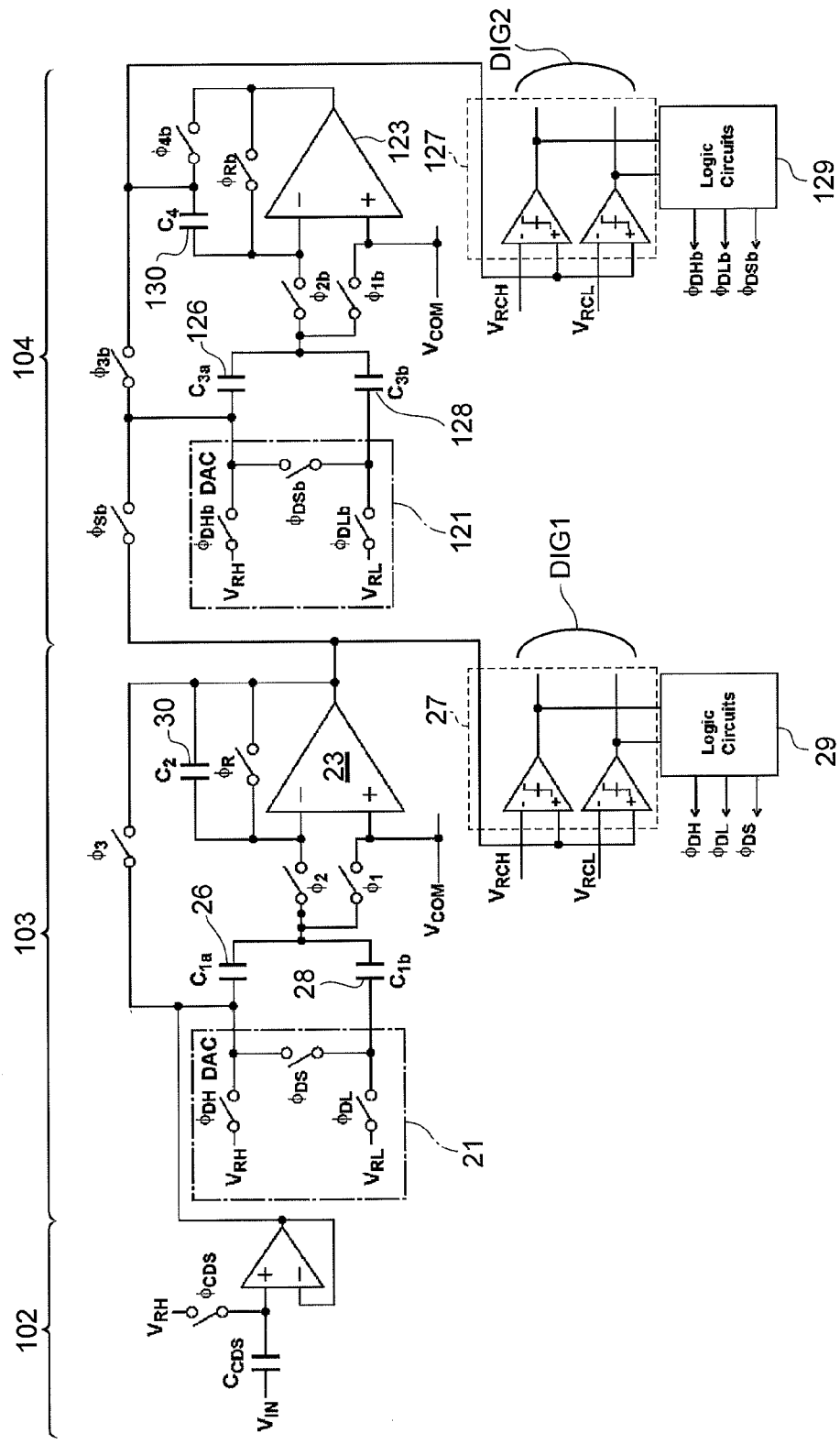
FIG. 12 is a diagram illustrating two cyclic A/D converter circuits connected in series.
Figure 13:
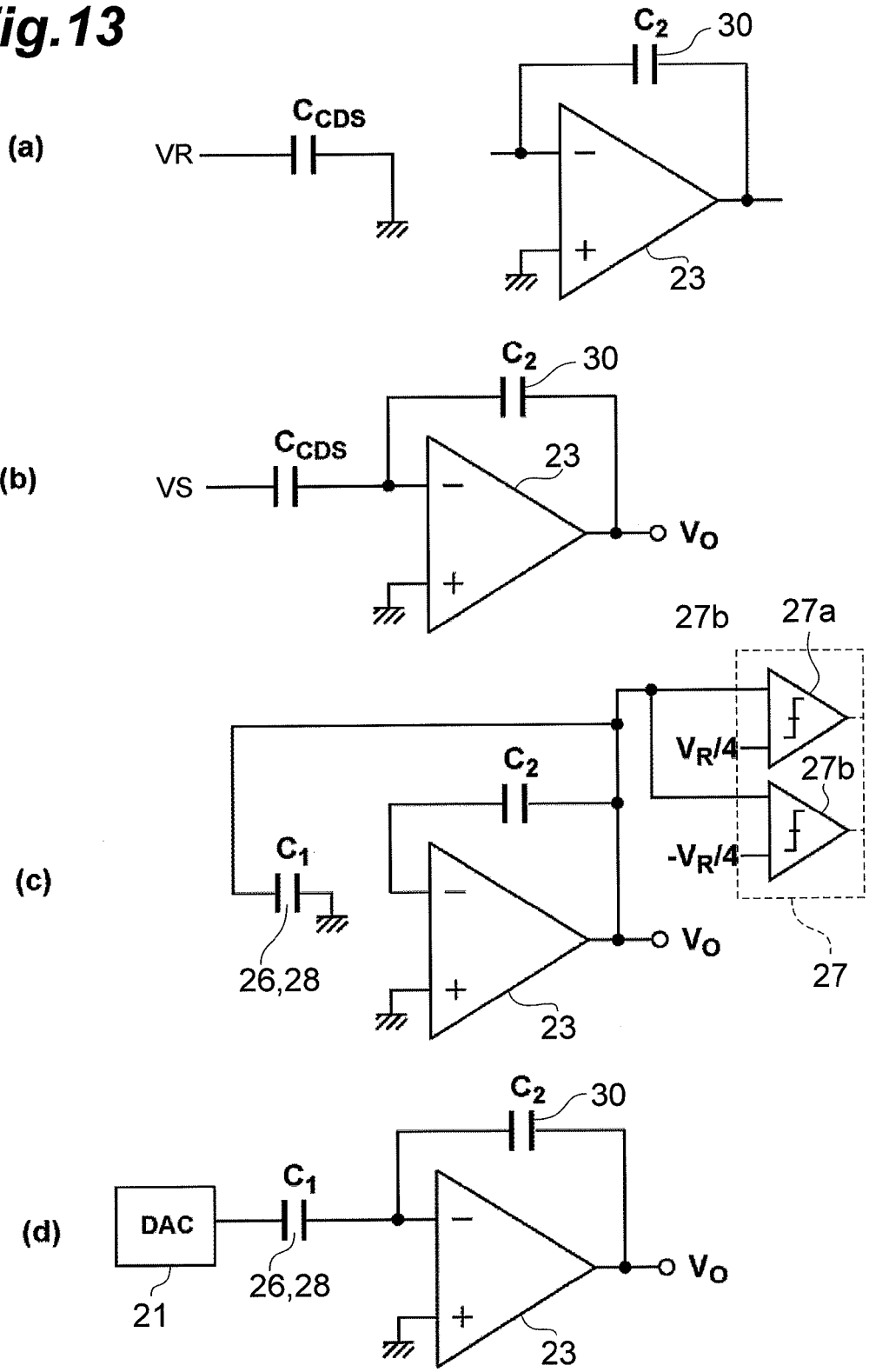
FIG. 13 is a set of diagrams illustrating an analog CDS action and an action of the cyclic A/D converter circuit at the first stage.
Figure 14:
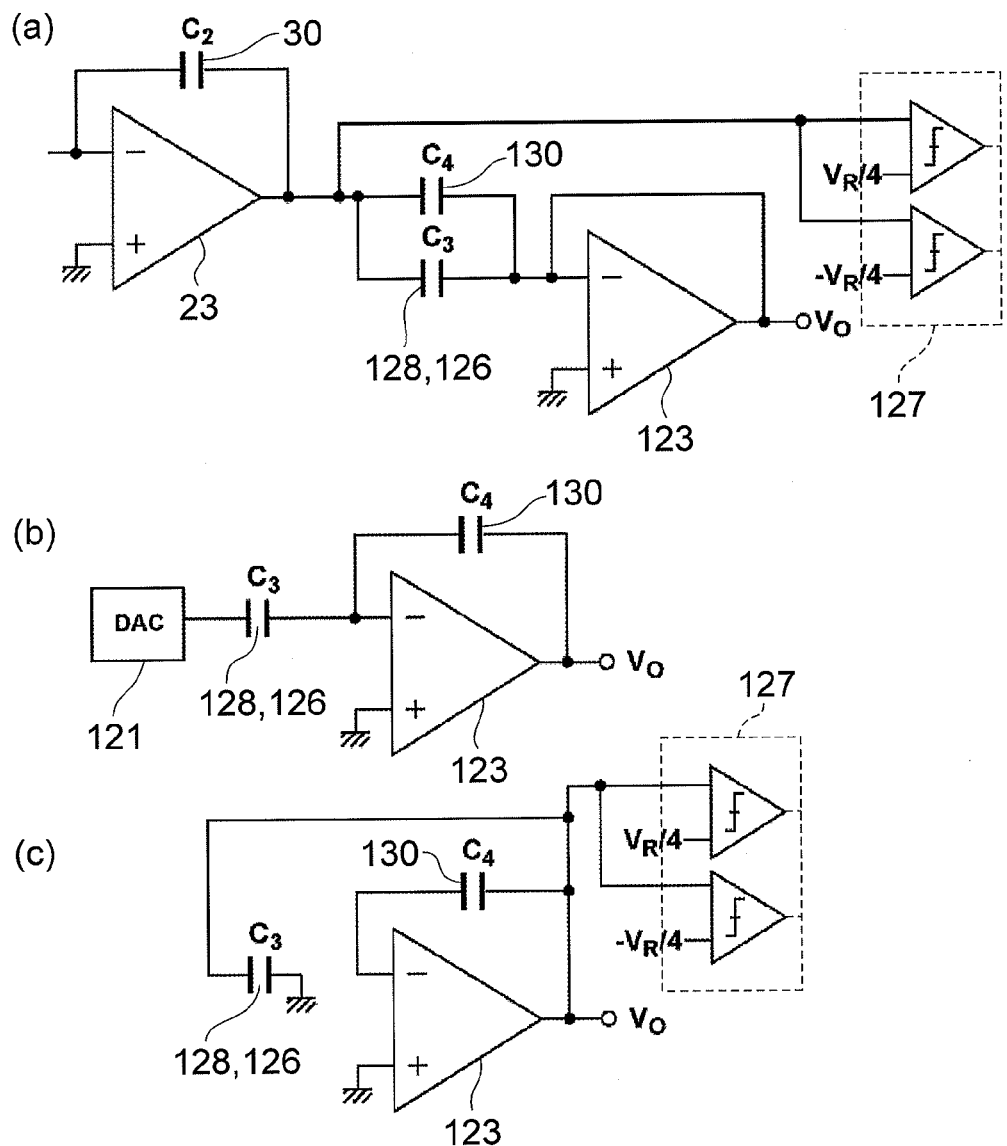
FIG. 14 is a set of diagrams illustrating actions of the cyclic A/D converter circuit at the second stage.
Figure 15:
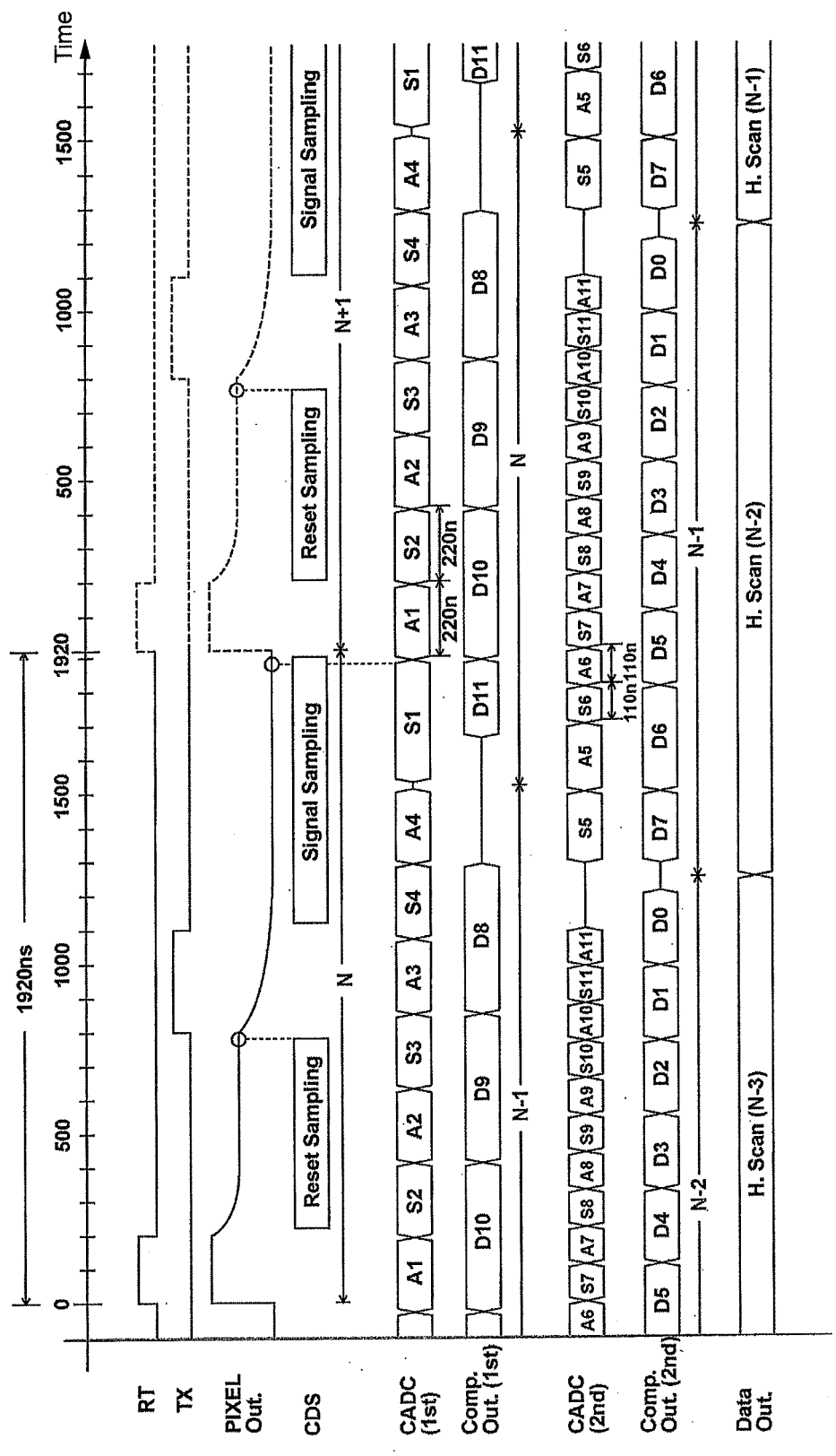
FIG. 15 is a diagram illustrating a timing chart of actions of the two cyclic converter circuits connected in series.

FIG. 12 is a diagram illustrating two cyclic A/D converter circuits connected in series. In this embodiment, two cyclic A/D converter circuits 103, 104 have circuit connections identical to each other, though their device sizes differ from each other. Circuit devices 121, 123, 126, 127, 128, 129, 130 are used so as to correspond to the circuit devices 21, 23, 26, 27, 28, 29, 30 in the A/D converter circuit at the first stage, respectively. In the embodiment illustrated in FIG. 12, a correlated double sampling circuit (CDS circuit) 102 including an analog correlated double sampling (CDS) capacitor and a buffer circuit is connected to an input of the cyclic A/D converter circuit 103. This circuit structure can perform a pipeline action of the CDS and the cyclic A/D conversion at the first stage. FIG. 13 is a set of diagrams illustrating an analog CDS action and an action of the cyclic A/D converter circuit at the first stage. FIG. 14 is a set of diagrams illustrating actions of the cyclic converter circuit at the second stage. FIG. 15 is a diagram illustrating a timing chart for actuating the array of A/D converters depicted in FIG. 11 as arranged in a column of a CMOS image sensor.

As illustrated in part (a) of FIG. 13, the reset level VR from a pixel is sampled into a CDS capacitor C$_{CDS}$. Subsequently, as illustrated in part (b) of FIG. 13, the CDS capacitor C$_{CDS}$ is connected to the operational amplifier circuit 23, and then the signal level VS from the pixel is sampled. As a result, the following value is generated at the output of the operational amplifier circuit 23.

$$V_O = (VR - VS) \times C_{CDS}/C_2.$$

Next, as already explained with reference to FIG. 4, a partially A/D-converted value is generated in the sub A/D converter circuit 27. As illustrated in part (d) of FIG. 13, with a D/A-converted value added to respective one ends of the capacitors 26, 28 according to the partially A/D-converted value, amplification and residue generation are performed. After a required number of cyclic actions are performed in the A/D converter circuit at the first stage, the residue value is fed to the cyclic A/D converter circuit 104 at the second stage.

Part (a) of FIG. 14 illustrates how the cyclic A/D converter circuit 104 at the second stage samples the residue value and generates a partially A/D-converted value of the residue value. Thereafter, by an action similar to that at the first stage, amplification and residue generation are performed with a D/A-converted value added to respective one ends of the capacitors 126, 128 according to the partially A/D-converted value as illustrated in part (b) of FIG. 14. Part (c) of FIG. 14 illustrates how the cyclic A/D converter circuit 104 at the second stage samples the residue value and generates a partially A/D-converted value of the residue value. A required number of cyclic actions are performed in the A/D converter circuit at the second stage.

Figure 16:
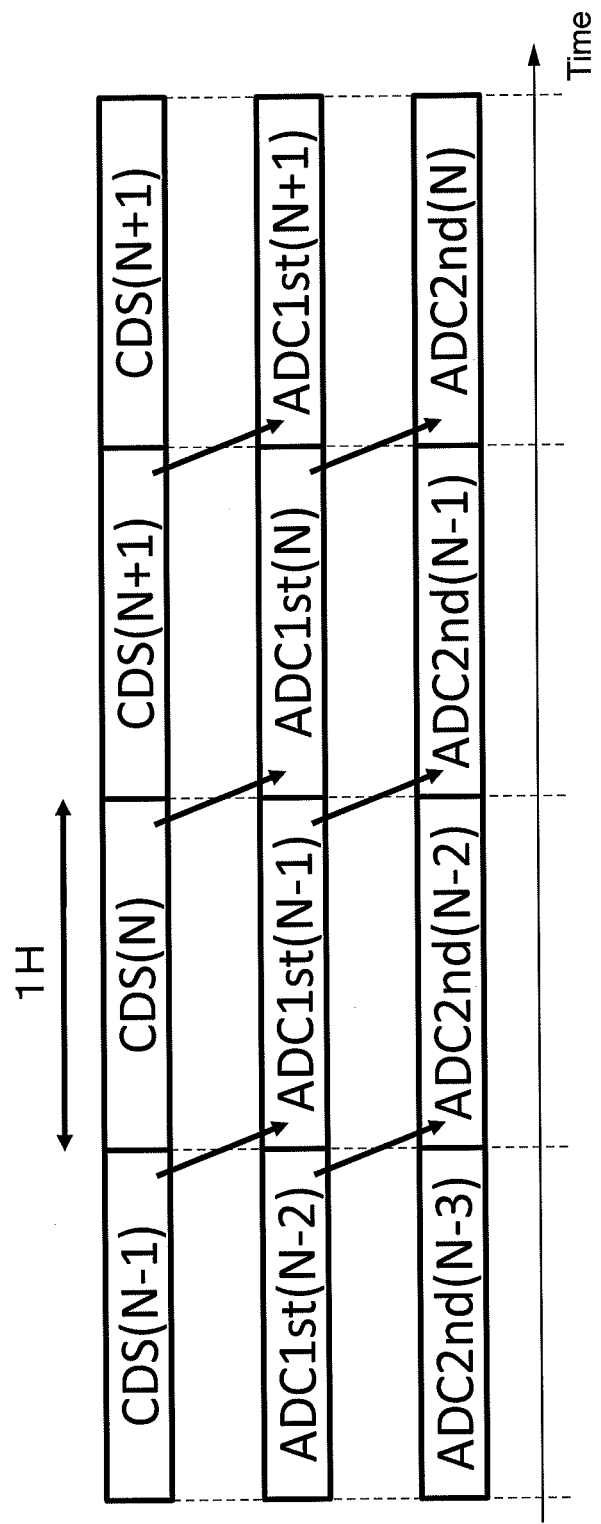
FIG. 16 is a chart illustrating pipeline processing in actions of the two cyclic converter circuits connected in series.

In the timing chart illustrated in FIG. 15, the number of cyclic actions at the first stage is 4, while that at the second stage is 7. FIG. 16 is a chart illustrating pipeline processing in actions of the two cyclic converter circuits connected in series.

Such a two-stage cyclic A/D converter circuit structure is advantageous in that the pipeline action illustrated in the timing charts of FIGS. 15 and 16 can perform the A/D conversion beyond one horizontal reading period (1H). This can also accelerate the conversion speed. Requirements for the conversion accuracy and noise are greatly lowered for the cyclic A/D converter circuit 104 at the second stage. For example, when the cyclic A/D converter circuit at the first stage performs 4 cycles (i.e., amplifications), the requirement for conversion accuracy and noise in the conversion action at the second stage can be lowered to $1/16$ of those in the action at the first stage. This allows capacitors used in the circuit at the second stage to become smaller in size, so as to reduce the bias current and transistor size in amplifiers, thereby decreasing the overhead in area and power consumption caused by the two-stage structure.

The over-range scheme can also be employed when the A/D converter circuit at the second stage performs the cyclic A/D conversion. In this scheme, the reference signal in the D/A converter circuit 121 in the cyclic A/D converter circuit 104 is changed such that $R2>R1=V_{RH}-V_{RL}$, for the over-range area.

INDUSTRIAL APPLICABILITY

As explained in the foregoing, the embodiments provide an A/D converter which uses A/D converter circuits for upper and lower digits of an A/D conversion and can lower the A/D conversion accuracy in the A/D converter circuit for the lower digit by employing a cyclic A/D conversion scheme for the upper digit.

REFERENCE SIGNS LIST

11 . . . vertical shift register; 12 . . . image array; 13 . . . pixel; 14 . . . cyclic A/D converter array; 15 . . . data register; 16 . . . horizontal shift register; 17 . . . redundant expression/non-redundant expression converter circuit; Ri, Si, TXi . . . control signal; 101 . . . A/D converter; 103 . . . cyclic A/D converter circuit; 105 . . . A/D converter circuit; 21, 121 . . . D/A converter circuit; 23, 123 . . . operational amplifier circuit; 23a, 23c . . . operational amplifier circuit input; 23b . . . operational amplifier circuit output; 25, 125 . . . gain stage; 27, 127 . . . sub A/D converter circuit; 27a, 27b, 27c . . . comparator; 29, 129 . . . logic circuit; 26, 28, 30, 32, 126, 128, 130 . . . capacitor; $L_{COM}$ . . . reference potential line; $V_{COM}$ . . . reference potential; $V_{OP}$ . . . operated value (residue); D . . . digital value; DP0, DP1 . . . digital signal; $V_{RCH}$, $V_{RCL}$ . . . reference signal; 61 . . . ramp signal generator circuit; 63 . . . comparator; 65 . . . Gray code counter; 67 . . . data latch; 71 . . . capacitor; 72 . . . inverting amplifier; 73 . . . capacitor; 74 . . . inverting amplifier; 75 . . . inverting amplifier; 91 . . . successive approximation A/D converter circuit; 92a to 92d . . . capacitor; 93a to 93e . . . switch; 94a to 94d . . . switch; 95a to 95e . . . switch; 97 . . . amplifier (comparator); 98 . . . switch; 101 . . . A/D converter; 103 . . . first cyclic A/D converter circuit; 105 . . . A/D converter circuit; 107 . . . record circuit

The invention claimed is:

1. An A/D converter for converting a signal from an image sensor into a digital value of N+M bits (where N≥2, M≥2), the A/D converter being arranged in a column of the image sensor and comprising:
   a first cyclic A/D converter circuit for receiving an analog value and generating a first digital value having upper N bits indicating the analog value and a residue value; and
   an A/D converter circuit for receiving the residue value and generating a second digital value having lower M bits indicating the residue value;
   wherein the first cyclic A/D converter circuit includes a sub A/D converter circuit, a logic circuit, a D/A converter circuit, and an arithmetic unit;
   wherein the sub A/D converter circuit generates a digital value having N1 bits (where N1<N) for each cycle;
   wherein the logic circuit receives the digital value from the sub A/D converter circuit;
   wherein the D/A converter circuit generates a D/A-converted value corresponding to the signal from the logic circuit;
   wherein the arithmetic unit has an input, an output for providing the residue value, and a feedback path connecting the output and input to each other for a cyclic A/D conversion; and
   wherein the arithmetic unit amplifies the input value received at the input and generates a difference between the amplified input value and the D/A-converted value.

2. An A/D converter according to claim 1, wherein the A/D converter circuit performs any of cyclic, integrating, and successive approximation A/D conversions.

3. An A/D converter according to claim 1, wherein the A/D converter circuit holds the residue value and performs an A/D conversion for generating the second digital value; and
   wherein the first cyclic A/D converter circuit feeds the residue value to the A/D converter circuit and then performs a cyclic A/D conversion of the next analog signal for pipeline processing.

4. An A/D converter according to claim 1, wherein the first cyclic A/D converter circuit generates a non-redundant code having a binary digital value for each of the N bits; and
   wherein the A/D converter circuit has an input range greater than a voltage range of an input range of the first cyclic A/D converter circuit.

5. An A/D converter according to claim 1, further comprising a correlated double sampling circuit connected between the image sensor and the first cyclic A/D converter circuit;
   wherein a pixel circuit of the image sensor generates a first signal level including a noise component and a second signal level including a signal component superposed on the noise component;
   wherein the correlated double sampling circuit receives the first and second signal levels and generates the analog signal;
   wherein the analog signal indicates a difference between the first and second signal levels; and
   wherein the correlated double sampling circuit receives a signal from a different pixel circuit of the image sensor after feeding the analog signal to the first cyclic A/D converter circuit.

6. An A/D converter according to claim 1, wherein the A/D converter circuit includes a second cyclic A/D converter circuit;

wherein the first cyclic A/D converter circuit includes a first capacitor for sampling an input signal to the first cyclic A/D converter, a second capacitor, and a first operational amplifier circuit, a ratio between the capacitance of the first capacitor and the capacitance of the second capacitor determining an amplification factor in an amplification by the first operational amplifier circuit;

wherein the second cyclic A/D converter circuit includes a third capacitor for sampling an input signal to the second cyclic A/D converter circuit, a fourth capacitor, and a second operational amplifier circuit, a ratio between the capacitance of the third capacitor and the capacitance of the fourth capacitor determining an amplification factor in an amplification by the second operational amplifier circuit; and wherein one of the following is satisfied: the third and fourth capacitors have sizes smaller than those of the first and second capacitors, respectively; and the first operational amplifier circuit has a size smaller than that of the second operational amplifier circuit.

7. An A/D converter according to claim 1, wherein the A/D converter circuit includes a successive approximation A/D converter circuit; and wherein the A/D conversion circuit has a conversion accuracy lower than that of the first cyclic A/D converter circuit.

8. An A/D converter according to claim 1, wherein the A/D converter circuit includes a single-slope A/D converter circuit; and wherein the A/D conversion circuit has a conversion accuracy lower than that of the first cyclic A/D converter circuit.

* * * * *